United States Patent [19]

Medney et al.

[11] Patent Number: 4,943,334
[45] Date of Patent: Jul. 24, 1990

[54] METHOD FOR MAKING REINFORCED PLASTIC LAMINATES FOR USE IN THE PRODUCTION OF CIRCUIT BOARDS

[75] Inventors: Jonas Medney, Rockville Center; Fred E. Klimpl, Great Neck, both of N.Y.

[73] Assignee: Compositech Ltd., Hauppauge, N.Y.

[21] Appl. No.: 907,863

[22] Filed: Sep. 15, 1986

[51] Int. Cl.$^5$ .................. B65H 81/00; H05K 1/03
[52] U.S. Cl. ..................... 156/174; 156/169; 156/233; 156/273.3; 264/137; 264/258; 428/107; 428/901
[58] Field of Search ............... 156/166, 169, 173, 174, 156/175, 180, 181, 182, 273.3, 273.5, 273.9, 275.5, 233, 252, 253, 260, 267, 285, 307.4, 307.7, 426, 434, 446, 629, 630, 901, 902, 242; 428/37, 105, 107, 110, 113, 114, 137, 285, 901; 264/102, 103, 136, 137, 258, 275, 278, 279.1, 156, 160

[56] References Cited

U.S. PATENT DOCUMENTS

| 2,344,537 | 3/1944 | Cone ..................... 154/2 |
| 2,406,846 | 9/1946 | Mueller . |
| 2,569,292 | 3/1946 | Dehmel ................... 242/9 |
| 2,589,503 | 3/1952 | McCullough ............. 29/155.5 |
| 2,638,278 | 5/1953 | Scott ...................... 242/9 |
| 2,874,045 | 2/1959 | Land ...................... 96/29 |
| 2,912,177 | 11/1959 | Oram et al. ............. 242/9 |
| 2,936,129 | 5/1960 | Bram ..................... 242/7 |
| 2,964,442 | 12/1960 | Hansen ................... 264/258 X |
| 2,974,284 | 3/1961 | Parker .................... 324/150 |
| 3,041,230 | 6/1962 | Diehl ...................... 156/426 X |
| 3,112,897 | 12/1963 | Eshbaugh et al. ....... 242/45 |
| 3,135,823 | 6/1964 | Pritikin ................... 174/68.5 |
| 3,143,306 | 8/1964 | Dijkmans et al. ....... 242/7.21 |
| 3,212,725 | 10/1965 | Dries et al. ............. 242/9 |
| 3,227,383 | 1/1966 | Zywietzf ................. 242/9 |
| 3,230,163 | 1/1966 | Dreyfus .................. 204/281 |
| 3,258,379 | 6/1966 | Ponemon et al. ........ 156/175 |
| 3,276,106 | 10/1966 | Bester et al. ............ 156/629 X |
| 3,324,014 | 6/1967 | Modjeska ................ 204/15 |
| 3,360,410 | 12/1967 | Romanin ................. 156/172 |
| 3,425,884 | 2/1969 | Brinkema ................ 156/161 |
| 3,425,885 | 2/1969 | Webb ..................... 156/242 |
| 3,480,498 | 11/1969 | Paul ....................... 156/175 |
| 3,511,739 | 5/1970 | Hebberling .............. 161/57 |
| 3,537,937 | 11/1970 | Medney .................. 156/426 |
| 3,565,741 | 2/1971 | Jaray ..................... 161/60 |
| 3,607,566 | 9/1971 | Medney et al. ......... 156/446 |
| 3,644,165 | 2/1972 | Chen ..................... 161/58 |
| 3,649,402 | 3/1972 | Schwencke .............. 156/175 |
| 3,664,786 | 5/1972 | Devine ................... 425/99 |
| 3,681,171 | 8/1972 | Hojo ...................... 156/382 |
| 3,740,285 | 6/1973 | Goldsworthy et al. ... 156/175 X |
| 3,756,905 | 9/1973 | Mills et al. .............. 161/60 |
| 3,779,851 | 12/1973 | Hertz ..................... 156/309 |
| 3,801,401 | 4/1974 | Cope et al. .............. 156/172 |
| 3,902,944 | 9/1975 | Ashton et al. ........... 156/175 X |

(List continued on next page.)

FOREIGN PATENT DOCUMENTS 1364076 8/1974 United Kingdom .

OTHER PUBLICATIONS

"Filament Winding", Encyclopedia of Polymer Science and Technology, 1970, pp. 713-719.

V. Kalinchev et al., "Namotannye Stekloplastiki," Moscow, Khimiya Publishers, 1986, pp. 31-32.

Primary Examiner—Michael W. Ball
Assistant Examiner—Geoffrey L. Knable
Attorney, Agent, or Firm—Pennie & Edmonds

[57] ABSTRACT

A warp-free laminate is produced by winding a first set of strands or filaments about a flat mandrel with a second set of strands being wound transverse to the first set. The two sets may be perpendicular to each other. The filaments are maintained under a controlled tension while being impregnated with a resin and during subsequent cure of the resin. In order to permit the formation of a warp-free product, the winding pattern is such that it forms a mirror image about a neutral axis or plane of symmetry. The winding pattern may be chosen to provide interstices in a predetermined pattern permitting punching out or high speed drilling of hole openings for subsequent printed circuit applications.

73 Claims, 18 Drawing Sheets

U.S. PATENT DOCUMENTS

| | | | |
|---|---|---|---|
| 3,960,635 | 6/1976 | La Roy et al. | 156/311 X |
| 3,984,598 | 10/1976 | Sarazin et al. | 428/336 |
| 3,990,926 | 11/1976 | Konicek | 156/3 |
| 4,053,370 | 10/1977 | Yamashita et al. | 204/13 |
| 4,073,699 | 2/1978 | Hutkin | 204/13 |
| 4,209,482 | 6/1980 | Schwarz | 264/135 |
| 4,214,026 | 7/1980 | Ibata et al. | 428/67 |
| 4,234,553 | 11/1980 | Langlands | 264/261 |
| 4,252,588 | 2/1981 | Kratsch et al. | 428/113 X |
| 4,290,838 | 9/1981 | Reavill et al. | 156/286 |
| 4,312,829 | 1/1982 | Fourcher | 264/571 |
| 4,313,995 | 2/1982 | Delgadillo | 428/201 |
| 4,357,395 | 11/1982 | Lifshin et al. | 156/233 X |
| 4,372,499 | 2/1983 | Bachinger | 242/50 |
| 4,381,852 | 5/1983 | Ferres et al. | 242/7.13 |
| 4,385,952 | 5/1983 | Futakuchi et al. | 156/174 |
| 4,415,403 | 11/1983 | Bakewell | 156/634 |
| 4,420,359 | 12/1983 | Goldsworthy | 156/275.5 |
| 4,454,184 | 6/1984 | Britton | 428/110 |
| 4,455,181 | 6/1984 | Lifshin et al. | 156/233 X |
| 4,460,633 | 7/1984 | Kobayashi et al. | 428/110 |
| 4,522,667 | 6/1985 | Hanson et al. | 156/182 X |
| 4,528,214 | 7/1985 | Long et al. | 427/173 |
| 4,529,139 | 7/1985 | Smith et al. | 242/7.02 |
| 4,539,253 | 9/1985 | Hirschbuehler et al. | 428/229 |
| 4,571,279 | 2/1986 | Oizumi et al. | 156/247 X |
| 4,606,787 | 8/1986 | Pelligrino | 156/233 X |
| 4,609,586 | 9/1986 | Jensen et al. | 428/901 X |
| 4,635,071 | 1/1987 | Gounder et al. | 343/912 X |
| 4,654,248 | 3/1987 | Mohammed | 428/137 |

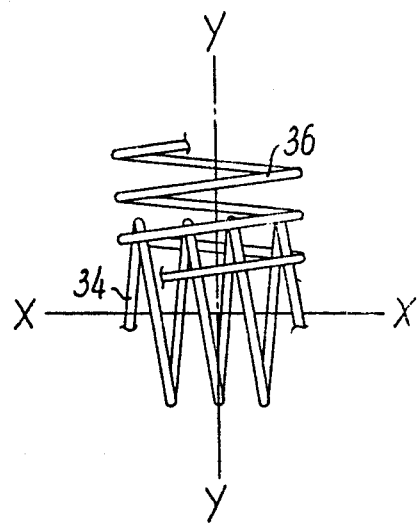
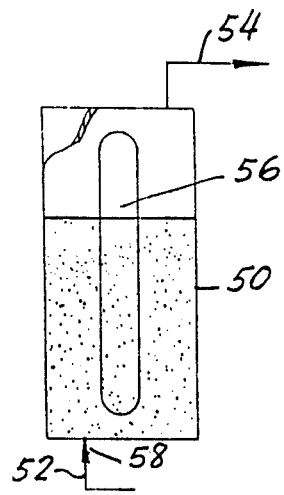
FIG. 3  FIG. 4
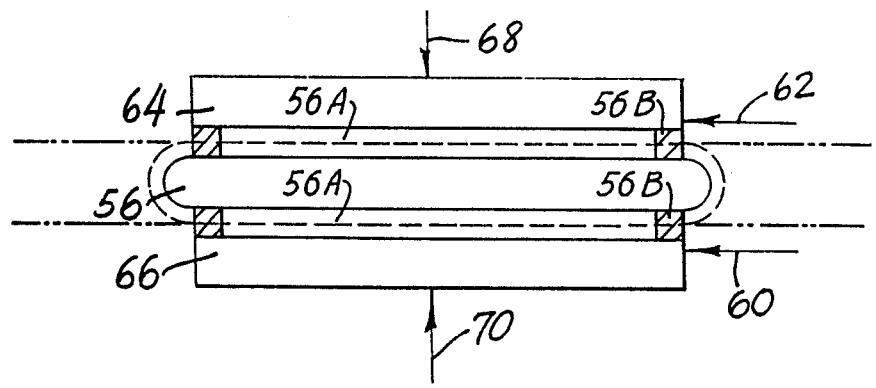
FIG. 5
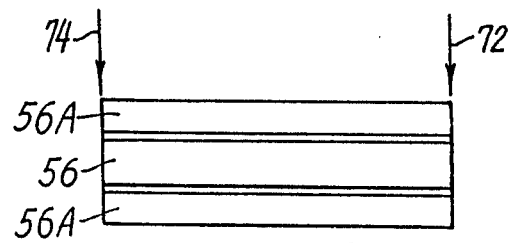
FIG. 6

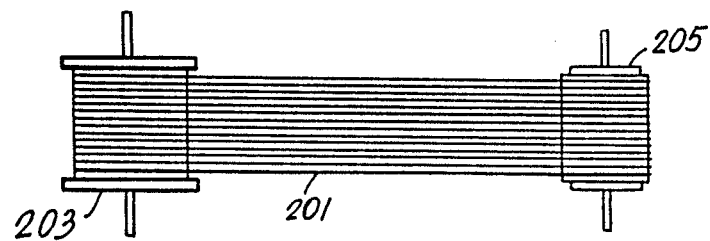
FIG. 11C
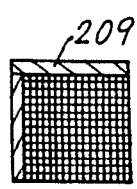
FIG. 11D
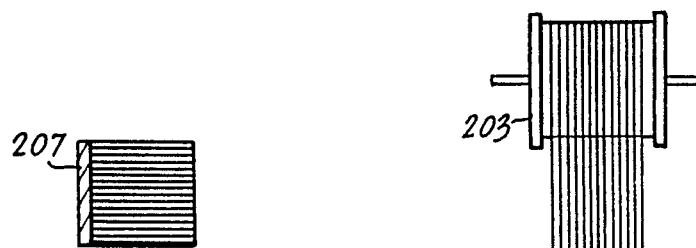
FIG. 11E
FIG. 11F

FIG. 19A    FIG. 19C3

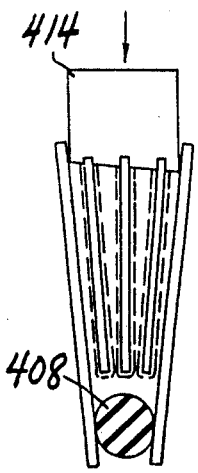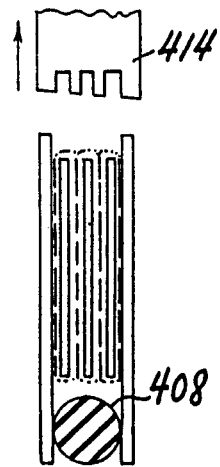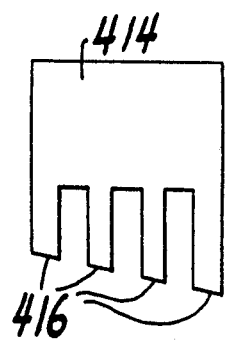
FIG. 19C2    FIG. 19C1    FIG. 19D

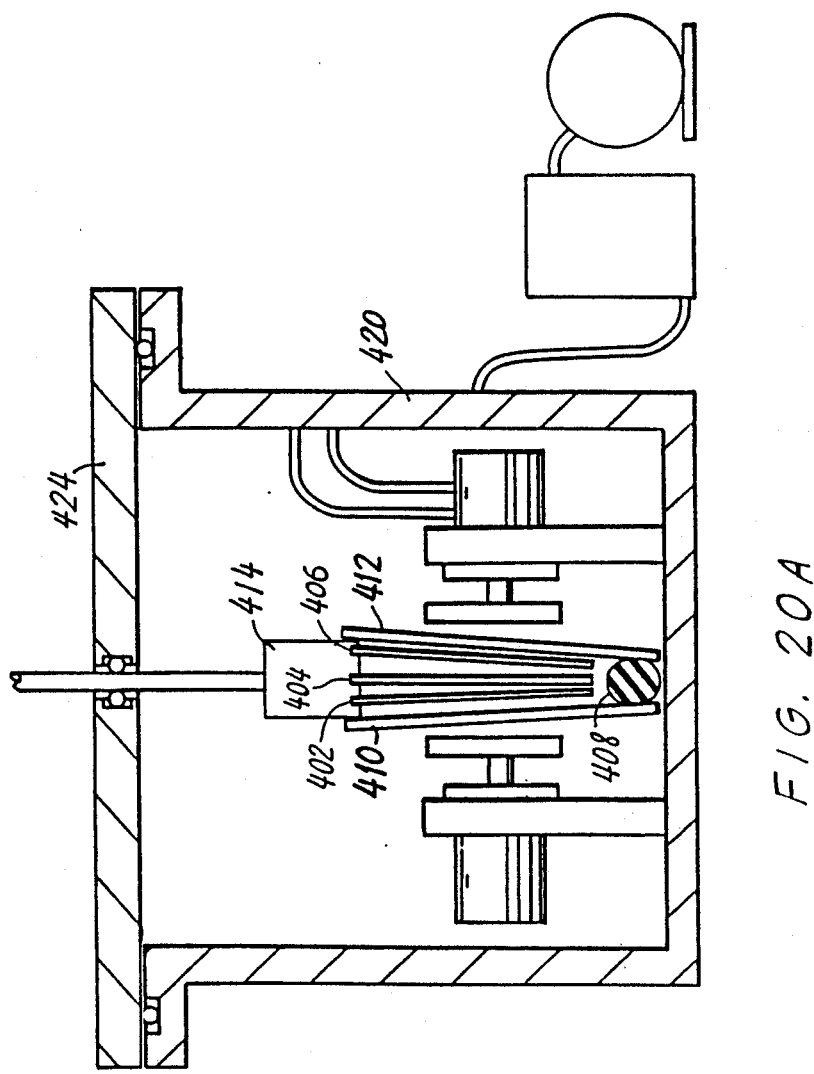

METHOD FOR MAKING REINFORCED PLASTIC LAMINATES FOR USE IN THE PRODUCTION OF CIRCUIT BOARDS

FIELD OF INVENTION

This invention relates to filament reinforced plastic structures and to related methods and products such as printed circuit boards.

BACKGROUND OF THE INVENTION

Conventional printed circuit boards are formed by utilizing cloth, particularly of fiberglass, which is then impregnated with a resin such as epoxy, and partially cured to a "B" stage condition. Copper foil treated on one side to effect good bonding may then be placed on one or two sides of the pre-impregnated "B" stage material. The thusly resulting assembly is placed between steel platens with a suitable mold release or a release film between the platens and the assembly is cured under heat and pressure to form a laminate, copper clad on one or two sides.

The copper clad or possibly unclad laminates are subsequently used for the production of printed circuit boards by a subtractive or additive process. Printed circuit boards are used in the electronics industry for circuitry. In general, holes have to be formed in the structure for the insertion of component leads (i.e., for resistors, capacitors, integrated circuit chips, transistors, etc.) or for the interconnection of circuits from one surface to one or more other surfaces.

The forming of holes (usually by drilling) in laminates reinforced with fiberglass or other hard reinforcing fiber material is difficult, expensive and creates problems which necessitate additional operations. The drilling runs into problems such as epoxy smear where the drill heats up, due to friction, to a temperature higher than the glass transition temperature of the plastic matrix and causes this plastic to smear over the edges of the copper. This smear must be removed by etch back to re-expose the copper to insure a proper connection with the thru-hole plated copper.

In researching prior art patents for purposes of examining the uniqueness of the present invention, U.S. Pat. No. 3,537,937 dated Nov. 3, 1970 has been encountered. Therein is disclosed an arrangement in accordance with which longitudinally arranged filaments are applied to opposite surfaces of an endless flat metallic band and additional filamentary rovings are helically wound thereover. The filamentary structure is resin impregnated before the band and structure pass through a resin curing apparatus wherein the resin is partially cured. Upon emerging from the curing apparatus, the resin and filamentary material along the edges of the band is removed and separate top and bottom filament would resin sheets of continous length are removed from the band and wound on spools.

This prior art could be suited for producing structural panels for mechanical loads. It does not contain teaching on structurally stable and balanced and flat thin sheets.

The method of U.S. Pat. No. 3,537,937 cannot produce layers wherein the filament sections are perfectly perpendicular to one another.

It is, accordingly, an object of the present invention to provide an improved laminate adapted for use in the manufacture of printed circuits and an improved method for making the same.

It is a further object of this invention to provide an improved laminate adapted to permit precise positioning of components.

It is yet another object of this invention to provide a filament-wound resin-bonded structure capable of being punched or at least drilled without the drills touching the reinforcing fibers. Additional objects of the invention are set forth below.

It is further object of the invention to provide for the design and control of the thickness of laminates, and the reinforcement-content-to-resin-content ration to values and tolerances not attainable with the previously known state of the art. The number of variables in the previously known process (such as weight of fabric, resin content, age and rheology of the prepreg, variation in heat history in all directions X, Y and Z of the book, i.e.; many layers of laminates and separator plates between platens in a press lead to wide variations in temperature versus time between laminates and even in parts of the same laminates. In the present invention, the laminate is molded to the exact thickness required with precise repeatability. The reinforcement can moreover be applied in situ in the exact amount the design calls for, even compensating for its yield variation, i.e., yards per pound. The resin matrix takes up the rest of the space and there are no voids. All this leads to latitude of design and tight control of wall thickness and reinforcement-to-resin ratio.

To achieve the above and other objects of the invention there is provided in accordance with a preferred embodiment of the invention a method which comprises forming a set of electrically non-conductive filament sections in at least substantially mirror image relationship about a plane of symmetry.

Viewed from another aspect, a reinforcement structure is configured in planar layers of at least substantially equally spaced parallel filaments. The direction of the filament sections may alternate in alternate layers and, in a preferred contruction, alternate layers are perpendicular to each other. It is also preferred to have the number of filament sections in the two perpendicular directions equal. It is further preferred that the filaments form a mirror image about the neutral plane or the center of the laminate or neutral axis thereof. According to the above preferred version of the invention, the angle between filament sections in different layers is substantially perpendicular such that the filament sections in adjacent layers are orthogonally related to one another. However, other angles can be used for special cases, and two or more parallel layers can be put together.

As will be shown hereinbelow the filament sections of each layer are a number of single or multi-filament arrangements would helically (or the like) and continuously around a flat form. Alternatively the filaments can be wound on some other suitable form and transferred to a flat form either layer by layer or in groups of layers. This filament arrangement may preferably be a bundle of untwisted filaments of the type commercially available in relatively flat form such as strand or roving, and ideally suitable for employment in accordance with the method of the invention.

According to one aspect of the invention, the filament arrangement is wound helically around a flat form which is preferably made in the shape of a right quadrilateral. Alternate layers or two or more parallel layers are respectively wound in criss-cross directions on this form. According to yet another aspect of the invention, the filament sections are embodied in a matrix of electrically non-conductive material which fixes the filament sections in position, and fills all the spaces or interstices between the two outer surfaces of the board not filled with filaments.

The layers are prefereably arranged in parallel planes. Moreover, in accordance with a preferred aspect of the invention, the aforesaid form has opposite sides connected by edges and the sets are formed on opposite sides of the form, the filament arrangement being brought from one side to the other of the form by traversing the edges thereof. The method further includes separating the sets by trimming the helically wound filament arrangement at the edges of the form.

According to yet another aspect of the invention, each filament arrangement employed is wetted during the winding on the form with a resin which is subsequently cured to form the aforesaid matrix. As an alternative, the filament arrangements may be wetted subsequent to the winding of the form by being immersed in a bath of resin or the like. The preferred method is to apply the resin in a vacuum impregnation method. An alternative is to partially impregnate prior to or during winding followed by vacuum impregnation with the same or compatible resin systems. Another alternative is to impregnate prior to winding.

As has been indicated hereinabove, the filament arrangements are formed as bundles of filaments. These bundles may be helically wound by effecting a rotation of the form. As an alternative, the filament arrangements may be helically wound on the form by revolution of at least one planetary source of filament arrangements about the aforenoted form.

In accordance with yet another aspect of the invention, an angle is controlled as between the form and the filament arrangements by relatively displacing the form and at least one source of the filament arrangement or arrangements. With respect to and in further accordance with the invention, the method may comprise forming a conductive surface on at least one of the layers formed thereby. Another aspect of the invention involves the feature of cutting a laminate out of each of the above-indicated sets. The laminate may be cut in quadrilateral form to have side edges generally perpendicular to the filament sections.

In accordance with still further aspects of the invention, the filament sections as will be seen may be of a material such as, for example, fiberglass, quartz, aramid or the like. The matrix may be of plastic resin and may be, for example, epoxy, polyimide, bismaleimide, polyester, vinyl ester, or polybutadiene. In the above-indicated arrangement, the layers are preferably planar and the filament arrangement is maintained under controlled tension as it is wound around the form. This provides for pre-stressing the filament sections and provides for a control of the various physical characteristics of the resulting product or products.

Yet another feature of the invention relates to bordering the above-noted form with a disposable rim which may be plastic and which is removable when the filament arrangement is trimmed as aforesaid. In accordance with the invention, the pitch of the helically wound arrangement may be controlled by controllably displacing the aforenoted form.

It is further within the purview of the invention to arrange an equal number of filaments in the X as in the Y direction, this constituting an especially advantageous feature of the invention which is useful in the sensitive applications which are envisaged. This is to get an equal T.C.E. (Thermal Coefficient of Expansion) in the X as in the Y direction. Moreover, the product can be arranged to have an essentially equal modulus of elasticity in both of the X and Y directions or a tailored different modulus in the X as in the Y direction.

While achieving the aforenoted advantages as well as objects of the invention, the filament sections may be arranged to form a spacing to accomodate a passageway through the resulting product in the Z direction which is perpendicular to the plane of X and Y. Other voids are, however, avoided by making the matrix of a curable substance which is cured with the filament sections therein and with the curing being effected with heat, and vacuum being employed prior to curing to remove all air and voids from the interstices, and accurate spacers can be employed to determine the final thickness of the product.

In the process of the present invention, a predetermined set of holes, which are void of reinforcing filaments, can be formed through the wound reinforcing layers. These holes can then be filled with resin in a molding operation and subsequently drilled or punched. By use of suitable tooling, the holes can also be formed in the molding operation, either in whole or in part, eliminating or reducing the drilling or punching operations required for use of the product.

In the preferred version, where the desired holes are filled with plastic in the absence of any reinforcing fibers, it is then possible to punch the holes depending on the properties of the plastic matrix. In the event that drilling is necessary, the drilling speed will be faster and will generate less heat, the drills or bits will last through the drilling of many more holes, the holes will be cleaner and can also be smaller, and there will be no resin smear, thus eliminating the need for etch back and accompanying problems.

Where the holes are formed, punched or drilled through the resin only, the margins will be resin only. This solid resin annulus surrounding the hole will act as a barrier to prevent any of the etching, plating, rinsing, or other such solutions from penetrating into the reinforcing fibers, the resin/reinforcement interface and micro-voids therein, or the interlaminar area. The solutions will also be prevented from penetrating any seeds, voids or hollows that may be present in the reinforcing fibers. In the current state of the art, all of the above areas are open to be penetrated and contaminated by the various solutions or residues therefrom. These solutions and residues can be conductive in which case, they can form unwanted conductive paths or short circuits. They can also be corrosive and erode the conductor and/or dielectric and cause failure in the circuit over a period of time.

In accordance with yet another feature of the invention, the above-noted conductive surface is formed by placing a metal foil on at least one side of the form or outer molding plate, the foil being transferred to the adjacent surface of the product. The alternative to the use of a metal foil in accordance with the invention involves plating at least one side of the form or outer molding plate with a metal which is capable of being transferred to the adjacent surface. It should be noted that it is within the scope of the invention to contemplate placing the conductive surface on the product in the configuration of a circuit on at least one side of the form or outer molding plate and transferring the metal as aforesaid. The conductive surface may be burnished or ground to achieve desired granularity and/or thickness.

The above objects, features and advantages of the invention relate to the method. However, it is to be noted that the invention also contemplates one or more structural configurations such as, for example, a structure which comprises a matrix and, embedded in said matrix, a plurality of filament sections arranged in parallel layers as implied by the method set forth in generalities hereinabove. The filament sections in each respective layer are preferably parallel and the filament sections in alternate layers may be arranged angularly with respect to one another. The angle is prefereably such that the filament sections in the alternate layers are at least substantially perpendicularly related. Advantageously for the end results contemplated within the scope of the invention, the filament sections and matrix may be electrically non-conductive. The layers may, moreover, as implied hereinabove, be of right quadrilateral configuration having pairs of opposite edges, the filament sections being at least substantially perpendicular to one of the pairs of edges. As also implied above, the filament section may be prestressed.

It follows from the method of the invention that the structure provided in accordance with the invention may include a metallic coating and the matrix may have at least one surface on which at least part of the metal coating is supported in accordance with one emodiment of the invention.

It also follows from the method of the invention that, if the matrix is provide with at least one hole, it will define an interior surface within the matrix. In this case the metallic coating may include a portion supported on at least a part of the aforesaid surface.

In the aforesaid structure, the layers are such that all of them can have a substantially equal number of filament sections. Alternatively, the layers can have a different number of filament sections by design in order to tailor the flexural modulus in the X or Y direction. The filament sections in each of the aforsaid layers are uniformly disposed about an axis, the axes of the alternate layers being transverse to one another in accordance with a preferred embodiment of the invention.

As has been noted already, herein, a preferred product of the invention is a printed circuit board. Since this board will be fabricated of the structure noted hereinabove, it will probably comprise a matrix having a plane of symmetry and, on opposite sides of this plane and within the matrix, it will include at least first and second layers of parallel filament sections, the filament sections in the first layer being angularly and preferably perpendicularly related to the filament sections in the second layer. Also, preferably but not exclusively, the parallel filament sections of the first layers on opposite sides of the plane of symmetry are at least substantially parallel to each other and furthermore they are preferably aligned with each other. Also, preferably, and in accordance with the invention, the aforesaid layers will have a like number of filament sections. These filament sections may be, according to one embodiment, under tension or, in other words, are prestressed.

As will be described in greater detail hereinbelow, the layers have respective axes which are transversely related, the filament section in the respective layers being uniformly distributed about the correponding axis. It will be seen that the matrix may have at least one surface comprising a metallic coating on at least part of the surface, thereby enabling the production of a printed circuit board. It has been implied above, and will be described in greater detail hereinbelow, that the filament sections can be arranged in the matrix to leave a portion of the matrix devoid of filament sections whereby the matrix may be provided with a hole extending through this portion. The printed circuit board of the invention will also involve the feature whereby the filament sections in the first layer are perpendicular to the filament sections in the second layer. Also involved is the feature whereby the matrix is or includes a section in the shape of a right quadrilateral with two faces in the shape of parallel planes and having four edges arranged in parallel pairs connecting these faces. In this arrangement, the filament sections of the first and second layers will be at least substantially perpendicular to respective of the pairs of edges.

While preferably the filament sections of the invention will be of untwisted filament structure, they may also be of twisted yarn or plied yarn structure. The filament sections may preferably be of fiberglass, aramid, quartz, carbon, nylon, polyester or the like. As set forth hereinabove, the matrix is preferably of a material such as bismaleimide, epoxy, polyimide, polyester, vinyl ester, phenolic, melamine, polybutadiene or the like.

The invention also involves the aspect of providing an apparatus for the preparation of a filament reinforced matrix. This apparatus will comprise generally a form, a source of filament, and a drive arrangement to effect a relative motion between the source and form such that the filament is wound about the form in at least first and second helices having orthogonally related axes. The apparatus of the invention may also comprise an arrangement for applying a settable resin to the helices to constitute the matrix. As noted above, a form is employed. This form may preferably be a flat mandrel or frame. The drive arrangement may include an arrangement to rotate this mandrel and for rectilinearly displacing the mandrel with respect to the source while the mandrel is rotating. Alternatively, the drive arrangement may include elements to displace the source in encircling relationship to the mandrel so that the source revolves about the mandrel. In this case, the drive arrangement will also include elements to displace the mandrel rectilinearly while the source is encircling the same.

In further accordance with the invention, there may be provided an arrangement to hold the mandrel sequentially in perpendiculary related postures for respective of the helices. A specific feature of the invention will provide that the mandrel include removable coating of conductive metal which is adapted for transferred to the aforesaid matrix.

Yet another feature of the invention involves that the mandrel be a flat metal plate having edges, there being furthermore provided removable plastic or other disposable rim members attached to these edges and adapted for being transversed by the aforesaid helices and being moreover adapted to facilitate a trimming of the helices at these edges.

Yet another feature of the invention relates to the provision of an arrangement for applying the settable resin in the form of a chamber to receive the form with the helices thereon, there being a source of resin operatively associated with the chamber and a further arrangement to effect a vacuum within the chamber to enhance penetration of the resin into the helices and render the same devoid of bubbles and other such voids. A further particular significant feature in the molding process is the use of outer plates with means to bring them into contact with stops and impregnated helices while under vacuum.

Still another feature of the invention involves the provision of a cam or electronic arrangement operatively associated with the source and/or the form with the filament to provide speed compensation and tension control for the supply of filament during the winding of the helices.

The above and other objects and advantages of this invention will be apparent from the detailed description which follows, as illustrated in the accompanying drawing.

BRIEF DESCRIPTION OF DRAWING

In the drawing:

FIG. 3 is a schematic showing of a winding pattern relative to a pair of orthogonally related axes;

FIG. 4 is a schematic showing of a vacuum impregnation chamber with the mandrel of FIG. 1 therein;

FIG. 5 shows the application of heat and spacing impregnated mandrel from outer plates with stops or spacers;

FIG. 6 shows schematically a trimming operation;

FIG. 8A1 illustrates a variation of FIG. 8A;

FIG. 11C diagrammatically illustrates the use of a beam for making a product of the invention;

FIG. 11D shows a clamping arrangement for holding the parallel filaments of FIG. 11C in position;

FIG. 11E diagrammatically illustrates laying filaments perpendicularly to those of FIG. 11C;

FIG. 11F shows a clamping arrangement for the filaments of FIG. 11E;

FIGS. 19A, 19B, 19C1, 19C2, 19C3 and 19D diagrammatically illustrates an assembly for forming a multilayer printed circuit board in accordance with the invention;

DETAILED DESCRIPTION

Figure 1:
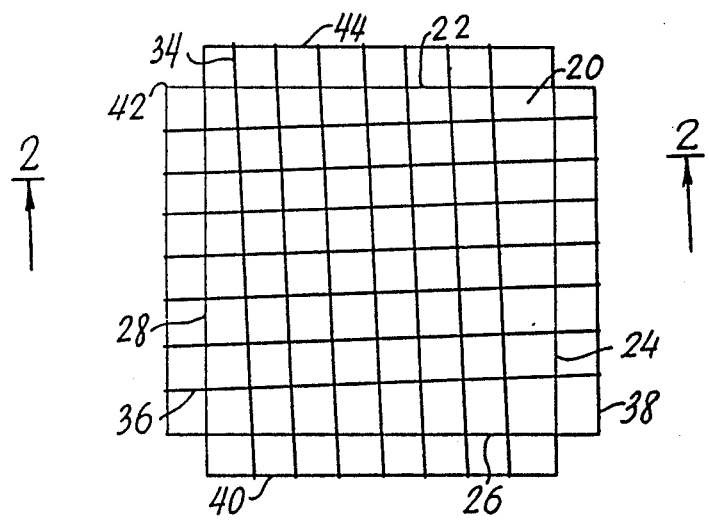
FIG. 1 is a diagrammatic view of a winding mandrel with a number of filaments affixed thereto in the course of winding.

In accordance with the invention, an improved material is provided for the improved production of printed wiring boards or printed circuit boards. This material is produced by filament winding reinforcements parallel to each other in sequential superposed layers in which the reinforcements are perpendicular to each other. While this particular configuration is employed to equal or exceed the current state of the art, other patterns can be wound within the scope of the invention and angles other than perpendicular or orthogonal can exist between the filaments of respective layers if other properties are desired.

In order to create warp-free laminates in accordance with the invention, it has been found that the selected patterns must form a mirror image (i.e., be symmetrical) about the neutral axis or plane of symmetry of the product. It has also been found that the layers can be designed so as to make the thermal coefficient of expansion and section modulus equal in the X and Y directions. The filament reinforcement is moreover pretensioned to certain limits discussed hereinbelow so as to assure that each filament is straight. The use of filament or untwisted fibers allows thinner, more uniform layers to be produced as compared with woven, twisted or plied yarns; but twisted or twisted and plied yarn can also be used in some of the embodiments of the invention.

The use of the wound reinforcement in place of the woven fabric of the currently known state of the art lowers cost by using fewer steps and more basic materials. It also eliminates many problems now encountered in the production of printed circuit boards.

The reinforcement (which may be fiberglass, aramid, quartz, carbon, nylon, polyester, aramid or other such materials) usually incorporates a surface finish that is compatible with the resin system matrix. It is combined with a matrix resin system such as epoxy, polyimide, polyester, bismaleimide, vinyl ester, phenolic, melamine, polybutadiene or other such materials in a manner as not to disturb the filament pattern. The matrix fully coats each filament and fills adjacent interstices. It is cured by an energy source such as radiant heat, built-in electrical resistance heaters, gas fired convection ovens, conductive heat surfaces, microwave equipment, or the like to effect a cured laminate.

The use of fillers may be integrated with the resin system.

Blends of fibers in various layers or alternating layers may be employed and, for example, conductive and non-conductive fibers may be mixed (i.e., for purposes of static bleed).

Tension is controlled so that at gelation of the matrix all of the reinforcement is at the same tension. The tension value must be such at gelation temperatures, that when reduced to ambient temperature, the strains induced by the tension in the reinforcement, the shrinkage of the resin, and the expansion/contraction of both due to temperature, balance so as not to induce a stress in the laminate that is greater than the critical buckling stress. Otherwise, a warped board results. The reinforcement should also be a mirror image about the neutral axis or be symmetrical about its center plane or plane of symmetry to prevent warping. It has been found that the amount of tension must be controlled so that the tensions in all layers in the same direction are equal and so that the amount of tension is minimum at gelation so as to induce zero or minimum compressive stress on the resin matrix.

The laminate regardless of thickness may have the same reinforcement-to-resin matrix ratio over a wide range volumetrically of approximately 0 to approximately 0.9. Currently known fabric-based laminates have a limited ratio range between approximately 0.15 to approximately 0.5, particularly in a thickness range between 0.001 inch and 0.062 inch. In accordance with the present invention, the straightness of the filaments, the planar character of the wound layers, the perpendicularity between filaments of adjacent layers, and uniform density of the resulting laminates regardless of thickness result in a more dimensionally stable material of tailorable, predictable and reproducible properties important to printed wiring board designs and production. The resultant laminate can have a reduced and uniform thermal coefficient of expansion along the X and Y axes (unlike woven and non-woven fabric based laminates) as a result of its unique construction.

Copper or other conductive surfaces may be applied for one or two of the surfaces by plating it on the tool surfaces (i.e., on the mandrel and outer plate surfaces), or applying copper foil to the same, in the process prior to the winding of the mandrel and resin impregnation. The process also lends itself to electroplating the conductive circuit only, eliminating the etching process and its problems. Conductive circuits embedded in the laminate can result. These circuits can be flush with the laminate surface or can also extend above the surface or part of both. The method results, it is believed, in a more superior adhesion than would be the case if copper were to be added to a cured laminate or partially cured laminate as with current known methods. The chemically treated copper surface can be coated with a suitable adhesive which is compatible with the surface and matrix resin system.

Laminate tolerances in thickness, surface smoothness, parallelism, resin-to-reinforcement ratio, warp and twist, copper-cladding thickness and uniformity can be better than previously achievable, resulting in unexpected design opportunities for improving dimensional stability, yield, producing a reduced and uniform thermal coefficient of expansion, improving automatic insertion or surface mounting such that a new class of design opportunities result.

One product of this invention is a novel composite of reinforcement such as fiberglass, quartz, aramid or other types of reinforcement in a plastic matrix such as: epoxy, bismaleimide, polyimide, polybutadiene or other such materials as have been mentioned herein and a conductor such as copper, silver, gold, etc. A primary characteristic of the product is due to the configuration of the reinforcement, and the absence or minimizing of voids, volatiles, and residual contaminants in the plastic matrix except for holes that may be intentionally formed in the laminate by an appropriate use of tooling.

The reinforcement is configured in planar layers preferably having at least substantially equally spaced parallel filaments. The direction of the filaments, preferably (but not exclusively), alternates in alternate layers and, in the preferred construction, the filaments in alternate layers are perpendicular to each other. It is also preferred to have an equal number of filaments in each of the two perpendicular directions. It is additionally preferred that the filaments form a mirror image about the plane of symmetry at the center of the laminate or neutral axis. Another novel configuration of the invention is one in which a predetermined pattern of holes is left void of reinforcing filaments. Alternatively, softer more easily drilled or punched filaments like polyester, nylons or the like can be wound in place of the void for the same purpose.

Laminates of this invention can be formed in the following manner:

Reinforcement in the form of strand, roving, filament, thread or yarn is wound with selected finite tension onto a form such as a ground and polished flat rectangular metallic mandrel. The mandrel may be, for example, of steel, stainless steel, titanium or other such material that has been covered with a conductor such as copper, either in the form of foil or by having been electrodeposited, chemically deposited, sputtered, or vacuum plated directly on the mandrel.

The conductor can be partly deposited on the mandrel and/or plates in the form of a circuit and the part of the mandrel not covered by the circuit can be covered by a release agent to prevent the plastic such as epoxy, from bonding to the exposed portion of the mandrel.

The filaments are wound in an equally spaced relationship and in a flattened helix-like pattern to fill the surfaces on both sides of the mandrel with filaments. This is considered herein to be a layer. The band of filaments is then fixed in some manner to the mandrel and can then be cut. The next layer is wound in such manner that the filaments in that layer are at some predetermined angle with the filaments of the preceding layer, usually at ninety degrees. This can be accomplished in a number of ways. In a lathe type filament winding machine, the mandrel can be remounted in the machine so that if the X axis was originally parallel to the centerline, the Y axis is subsequently placed parallel to the centerline for winding the next layer. In a carousel type winder (where a spool or spools of filaments are mounted on a ring which rotates about the mandrel which is fixed in a plane but which moves one designed pitch per rotation of the ring in the X direction until both sides of the mandrel are full of filaments) and after tie-off and cutting, the mandrel is moved through the same or another carousel in the Y direction to form a layer of filaments perpendicular to the preceding layer.

Alternate layers are applied until the reinforcement layers reach the desired or design thickness. The reinforcement is to be in the configuration outlined in the product description hereinabove. There should be an equal amount of filaments in the X and Y direction. The filaments should be a perfect mirror image about the center plane of each of the reinforcement panels on both sides of the mandrel. To accomplish this, the last layer must be the same as the first layer and the next to last layer, the same as the second layer, etc. It is also possible and desirable to produce a match or produce a designed mismatch (for example, to save weight) of the section modulus in the X and Y direction by varying the thickness and reinforcement density in the various layers. The tension should be the same as described in the product section above. The reinforcements can be impregnated or partially impregnated with resin prior to winding or during winding prior to being placed on the mandrel. However, the preferred method is to wind the reinforcement dry or as received from the supplier, the wound assembly being subsequently impregnated with resin after the assembly has been placed in a suitable chamber which has been evacuated to form a vacuum.

A preferred absolute pressure of vacuum in the above should be less than 2 mm of mercury. The chamber should also contain a suitable container with the proper plastic resin in it or means should be provided for injecting resin into the container while the chamber is under vacuum condition. The chamber should also contain two outer plates each of which contains one side which is ground and polished and is surfaced with either a complete layer of copper or some other conductor or a circuit of copper or some other conductor as was the mandrel in the above. Either the four corners of each side of the mandrel or the four corners on each of the outer plates should have stops equal to the desired thickness of the laminate to be produced, protruding from the surface. This is the preferred method. However, other means of effecting a positive stop may be used and laminates may as well be formed without using stops. In the chamber, there are suitable means for lining up the mandrel with the outer plates and for moving the mandrel in and out of the container of resin, and for moving the outer plates so as to contact the stops and the product.

After the chamber is evacuated to the desired pressure, the mandrel is placed into the resin so that all the reinforcement on the mandrel is under the surface of the resin. After a period of time which depends on the thickness and density of the windings, the conductor-covered or mold released or combination thereof faces of the two outer plates are brought in contact with each of the two sides of the mandrel which are covered with reinforcement and impregnating resin. The desired distance between the faces of the outer plate and the mandrel is determined by the thickness of the stops used between the plates.

After another period of time, the vacuum is released from the chamber and the assembly is allowed to drain so that the excess resin is returned to the container. The contact of the outer plates to the stops on the mandrel is maintained during this entire period. Heat energy is then applied to effect the cure. This can be effected by the use of electric power, hot oil, steam applied to the plates, or microwave or radiowave energy. In the microwave or radiowave technique the outer plates may constitute one pole with the mandrel constituting the other pole and the product constituting a dielectric between the poles.

After a suitable cure period, the plates are separated and the product is trimmed and removed from the mandrel. The mandrel and outer plates are cleaned and made ready to process more material. The laminate is then trimmed and inspected. It is pointed out that the process will work with multiple mandrels and outer plates (i.e., two mandrels and four outer plates, etc.).

There are a number of alternates to the impregnation and molding process. In one method, the mandrel and outer plates are in the chamber but above the container of resin. The outer plates are adjacent to but a finite distance away from the mandrel. The proper amount of resin is in the container. The chamber is sealed and evacuated to the proper vacuum and a finite time such as a few seconds elapses. The mandrel is lowered into the resin until all of the reinforcement is under the level of the resin. After a period of time suitable for the reinforcement to completely wet out, the mandrel is raised out of the resin to its original position between the outer plates. The wet-out time needed will depend on variables such as the thickness of the reinforcement, viscosity and thixotropy of the resin, surface tension of resin reinforcement interface, etc. The wet-out mandrel is allowed to drip excess resins to the container for a finite time. Mechanical stripping of the excess resin may also be performed. The outer plates are moved, to close to the stops on the mandrel. This can be done all at once or by closing the gap from the bottom up or top down so as to achieve a wash action and force any remaining air, volatiles or bubbles out of the laminate. After closing the outer plates the vacuum can be released and the cure can begin. The cure is the same as in the above.

In still another version, the container for the resin can be formed using the two outer plates sealed on two sides and the bottom with tape or a flexible rubber-type gasket. The resin can be in this container along with one or more wound mandrels.

All of the above are in a suitable chamber, which is then evacuated to the proper vacuum. The mandrel is then lowered to a position between the plates and the plates are moved into the stops. At this point, the resin level is above the reinforcement on the mandrel. The vacuum is subsequently released and the excess resin drained, and the laminate cured as in the above.

In a like manner, the two outer plates can form the vacuum chamber and resin container with sealing being effected completely around all four sides with tape or suitable gaskets after the mandrel is included between and spaced from the outer plates. Provision is made for evacuating the thusly formed chamber as, for example, a hole through the gasket or outer plate which is connected to a hose or pipe which goes to a vacuum pump. External means are provided to keep the outer plates from moving toward each other as the chamber so formed is evacuated. In this case, the chamber is evacuated to the desired vacuum. The resin is injected into the chamber, preferably from the bottom up. After enough time is allowed to wet out the reinforcement, the outer plates are closed to the stops and the mandrel. The vacuum is then released, and the assembly is drained of excess resin and cured as in the above.

Reference is next made to the drawing and, particularly, to FIGS. 1, 2, 2A, 2B and 3. Therein will be seen a form or mandrel 20 which is fabricated, by way of example, of steel or stainless steel or titanium or the like.

The mandrel 20 should preferably be of a rigid hard material preferably flat to within less than 0.015 T.I.R. and should preferably have a surface finish less than 45 R.M.S. It may be capable of serving, in certain circumstances, as a base for a foil or electro-plated coating or the like. It is preferably in the shape of a right quadrilaterial having edges 22, 24, 26 and 28. These edges connect the faces 30 and 32 which are both planar and parallel. As illustrated, the form or mandrel 20 serves as a basis for receiving the winding thereon of two helices or the like indicated generally at 34 and 36 (see FIG. 3). These helices are wound uniformly about neutral axes X and Y which represent orthogonally or perpendicularly related directions. The helical windings 34 and 36 are preferably each of uniform pitch, but if perpendicular the pitch of each will vary proportionally to the length of each. They are also preferably continuous. In accordance with a preferred embodiment of the invention, they are uniformly distributed to both sides of the respective axes, thereby to provide when subsequently trimmed, a plurality of uniformly spaced substantially parallel filament sections as mentioned hereinabove.

The helices 34 and 36 are shown in FIG. 1 as well as in FIG. 3 wherein it is seen that the preferred windings are at least substantially perpendicularly related to one another. It will also be seen that the mandrel 20 is supplied at its various edges with extensions 38, 40, 42 and 44 which can be plastic or other suitable material. As shown in FIG. 2A, the extension, such as exemplified by extension 42 can be keyed to the mandrel 20 by means of a pin or key 46 extending between appropriately positioned holes or slots provided in the mandrel and associated edge or rim portion as appropriate for mounting the rim portion on the mandrel. Alternately, the edges such as exemplified by edge 38 in FIG. 2B can have means such as screw 38A for adjusting the overall length or width of the mandrel which adjustment can be used for adjusting the tension layer by layer or all layers at once.

Figure 2:
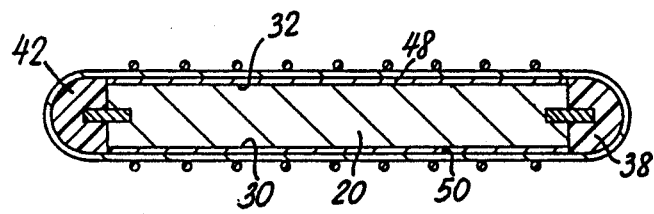
FIG. 2 is a sectional view taken along line 2—2 of FIG. 1 in one position of the mandrel.
Figure 2A:
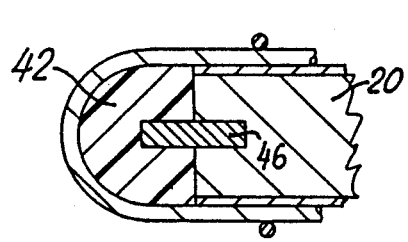
FIG. 2A is an enlarged view of a detail possibly incorporated into FIG. 2.
Figure 2B:
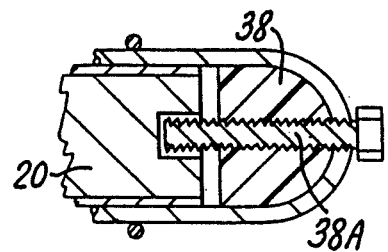
FIG. 2B shows a variation of the detail of FIG. 2A.

Also indicated diagrammatically in FIG. 2 are metallic coatings 48 and 50. Such coating may preferably be copper although other suitable materials such as silver and the like, as mentioned hereinabove, may also be employed. These coatings may be in the form of a suitably thin foil which is peelably removable from the respective faces 30 and 32 of the mandrel 20. Alternatively, the coatings 48 and 50 may be plated onto the tool or mandrel 20 or applied in any other such suitable manner provided only that they are preferably detachable from the mandrel in order to be integrated into the product being formed thereupon. In a like manner, elements 48 and 50 may be partial coatings in the form of a printed circuit or the like.

FIG. 4 diagrammatically illustrates the incorporation into the product of a matrix which is preferably formed of resin or the like. The material which constitutes the matrix is preferably electrically non-conductive. It is preferably a liquid but hardenable plastic resin which is capable of responding to heat and/or pressure to effect a gelation which is free of voids or impurities. In the case of thermosets, the materials can be cured or cross linked by means of heat. In the case of thermoplastic materials, these may be gelled by lowering the temperature under the melting point. As a matter of fact, aside from holes which are intentionally incorporated into the design of the product and metallic inclusions which are preferably in the form of electrical circuitry or the like, the only other matter which is usually incorporated into the matrix consists of the filament sections which are formed as indicated above and as will be described in greater detail hereinbelow. Exceptions to this rule include particulate fillers; spherical, solid or hollow fillers; and plate-like or flake fillers. It should be noted that the matrix will preferably be of a material selected from the group consisting of epoxy, polyimide, bismaleimides, polyester, vinyl ester, polybutadiene, polyphenilene sulfide, phenolic and melamine or any other material mentioned herein. It will also be recalled from what has been stated above that the filaments or filament sections are preferably of a material such as, for example, selected from the group consisting of fiberglass, aramid, quartz, carbon, nylon and/or polyester or the like. It will be understood that for particular applications and to achieve particular results and to serve particular purposes, combinations of the aforesaid materials may be employed and, in fact, there will be other materials which may be substituted for those which have been listed herein.

FIG. 4 illustrates diagrammatically an arrangement whereby the resin is incorporated into the helical windings to constitute a partially completed product. In FIG. 4 is illustrated a chamber 50 having attached thereto a source of liquid resin at 52, there being attached to the chamber 50 an apparatus diagrammatically illustrated at 54 for purposes of applying a vacuum within the chamber 50. Within the chamber 50 is diagrammatically illustrated a product 56 consisting of helical windings as described and discussed hereinabove. A vacuum 54 is first applied to the chamber, then resin is admitted into the chamber 50 as indicated by the arrow 58 in selective manner and thereby to enhance penetration of the resin into the wound helices, thereby to avoid the inclusion of bubbles and such other voids in the partially finished product and thus in the finished product as well.

FIG. 5 illustrates diagrammatically the application of heat as indicated by arrows 60 and 62 to the platens 64 and 66 with the mandrel 56 and product 56A therebetween. The pressure applied to the platens is indicated diagrammatically at 68 and 70. This pressure is just enough to close any space between platens 64, 66, stops 56B and mandrel 56. The product or partially completed product is treated by the application of heat, thereby to cure the resin and control the thickness of the product by maintaining the distance between 56 and 64 and between 56 and 66 by setting it with accurate stops 56B.

FIG. 6 illustrates the outer plates 64 and 66 removed and the thusly wound and resin-impregnated product 56A is then subjected to edge trimming, as indicated diagrammatically by arrows 72 and 74. Thereby the rim portions 38, 40, 42 and 44 (see FIG. 1) and the edge portions of the respective helices traversing these rim or edge portions are removed. This results in severing the completed products 56A into two section both of which preferably are, respectively and individually, mirror image structures with respect to their own center planes of symmetry. The fact that the filament sections therein are parallel and evenly spaced and evenly distributed about neutral axes results in a product which is dimensionally stable, which avoids warping, which has a uniform thermal coefficient of expansion in the X and Y direction and which can have a tailored and well-controlled modulus of elasticity in the X and Y direction.

Figure 7:
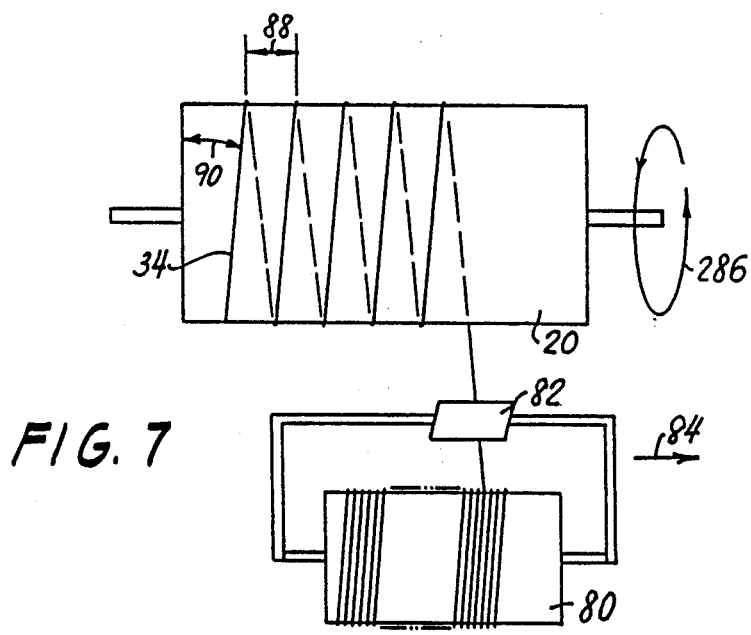
FIG. 7 diagrammatically illustrates an apparatus for filament winding onto a mandrel.
Figure 8:
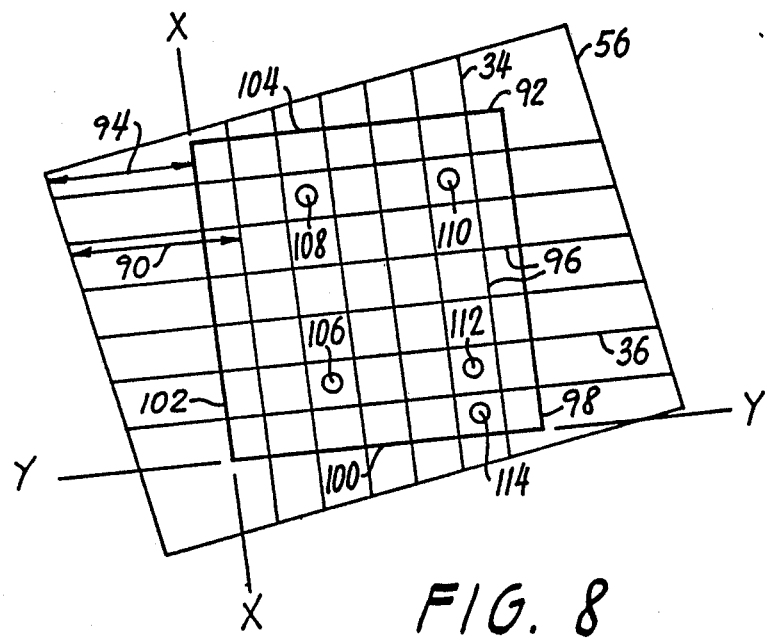
FIG. 8 diagrammatically illustrates a typical completed winding and a typical cutting out of a circuit board.

FIG. 7 illustrates the rotation of the tool or mandrel 20 in accordance with one embodiment of the invention thereby to provide a relative movement between the tool and the source 80 of filamentary material which enables the winding of a helix (for example, the helix 34 on the mandrel 20). The pitch of the helix is controlled by a movement of a guide 82 in accordance with one embodiment of the invention in the direction indicated, for example, by arrow 84. Rotation of the mandrel 20 is indicated by arrow 86. The pitch of the helix is preferably continuous and regular with the spacing 88 between consecutive turns being preselected and uniform as desired. In the case where it is desired to leave voids in the winding for subsequent holes, it may be necessary to periodically advance the pitch. This can also be accomplished by putting upsets on the tooling or a combination of both. It will be noted that the pitch angle 90 which may also be termed the lead angle is controlled by controlling the speed of movement of the guide 82 in relation to the speed of rotation of the mandrel 20. This lead angle may be as close to a perpendicular relationship as desired. There is a relationship between the pitch angle and the band width of the filaments being wound when the filaments are applied in groups or bands. For complete coverage with one band abutting the next with no overlap the guide 82 should advance one band width for each revolution of the mandrel 20. However, such a selection of pitch angle is not necessarily required inasmuch as a partially completed product may be punched or cut out of the resulting intermediate product as illustrated in FIG. 8. Nonetheless, the band width and pitch are preferably calculated to give the end product the desired reinforcement-to-resin ratio.

In FIG. 8 is illustrated product 92 with its X and Y axes. The intermediate product 56 has corresponding X and Y axes (not shown in FIG. 8) relative to which the abovementioned lead angle applies as indicated by way of example at 90 in FIG. 8. It is then possible to punch therefrom a further developed intermediate product indicated at 92 and termed, for example, a laminate for reason which will become apparent hereinbelow. Herein will be seen the remains (i.e., filament sections) of the trimmed helices 34 and 36 but it will now be apparent that due to the displacement between intermediate product 56 and product 92 as indicated by angle 94 that the filament sections indicated at 96 are now relatively perpendicular to the edges 98, 100, 102 and 104 of the cut-out portion or laminate 92 which thus results in the preferred embodiment of the invention as regards the product which is provided in accordance with the invention.

Also illustrated in FIG. 8 are a plurality of holes representing voids in the wound filaments such as indicated by way of example of 106, 108, 110, 112, and 114. Since the laminate product or intermediate product of the invention is in preferred form integrated into a printed circuit board construction, it is preferably provided with such holes in order that connection can be made between the various conductors and/or metallic coatings which are embodied in the product as it is developed and as has been discussed in general terms hereinabove.

Figure 8A:
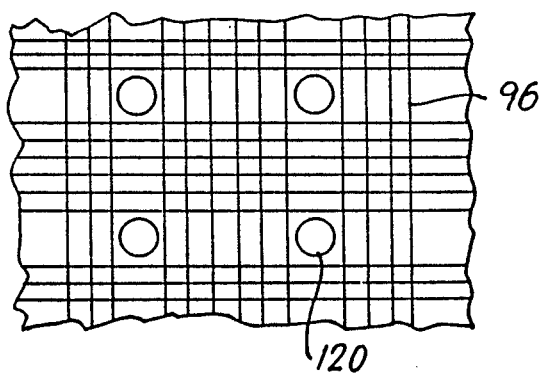
FIG. 8A diagrammatically illustrates a pattern providing for holes in a printed circuit board.
Figures 1, 8A:
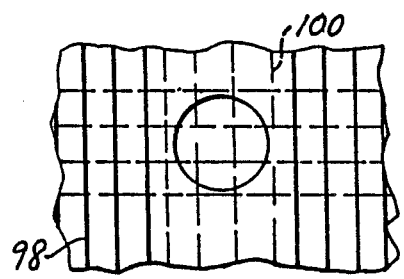

FIG. 8A illustrates that the filament sections 96 can be arranged in such a form as to define sections 120 which are free of filament sections 96. In a preferred form of the method of the invention, if is these spaces in which the holes mentioned above are formed. FIG. 8A1 illustrates that harder and softer filament sections 98 and 100 can be used for the same purpose; that is, to facilitate the formation of holes. The advantage of the above techniques is that the absence of interference of the generally harder and more abrasive filament sections avoids the wearing of tools and facilitates the punching of holes without the various difficulties which are usually attendant thereto.

Figure 8B:
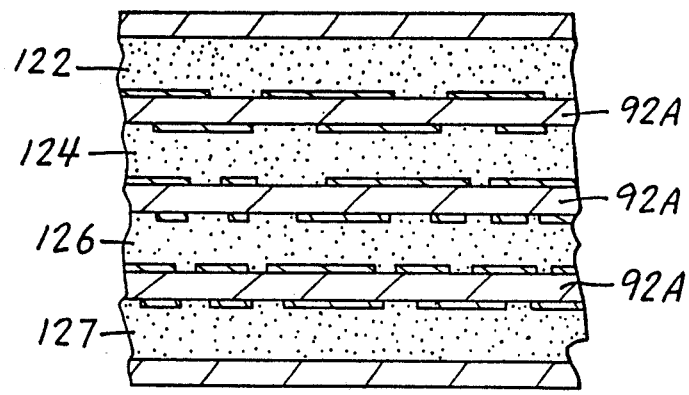
FIG. 8B illustrates a multilayer printed circuit board provided in accordance with the invention.

FIG. 8B illustrates a fragment of a plurality of printed circuit board 92A sandwiching there between dielectric as indicated at 122, 124, 126 and 127. This diagrammatically illustrates that the product 92 may be printed, etched, drilled, plated, etc. to form a printed circuit board 92A and may be incorporated into a multilayer circuit board, whose function is to provide more densely packed electrical circuitry. The metallic coatings may also be applied to the mandrels for utlimate application to the laminates and may be applied to the mandrel configured as a circuit. If the method is practiced in this manner, this will avoid the need for ultimate etching operations as well as other costly and undesirable steps as are now considered as being normally incorporated in the previously known procedures.

Figure 9:
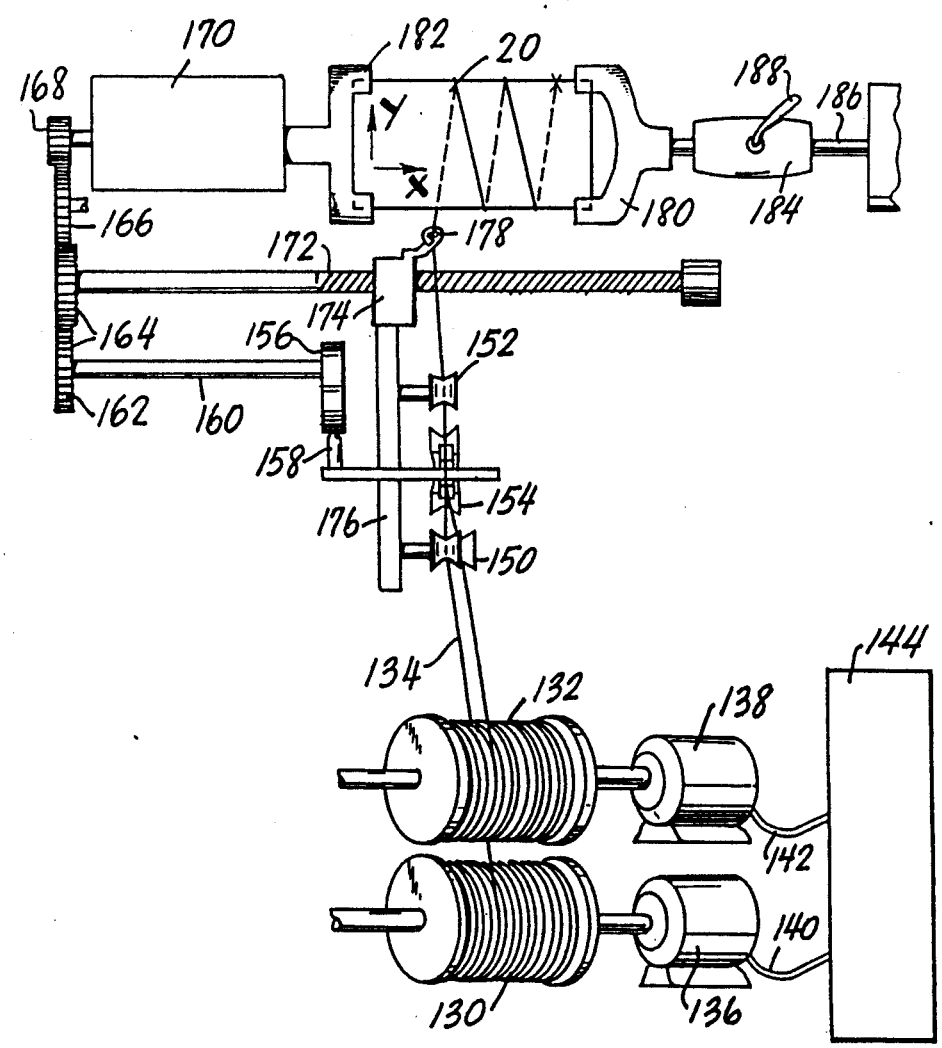
FIG. 9 illustrates an apparatus for automatically practicing one form of method of the invention.

FIG. 9 illustrates in greater detail but still diagrammatically an apparatus for practicing one of the methods of the invention. Therein are illustrated sources 130 and 132 of filament arrangement or arrangements 134. This arrangement may be a single solitary strand or filament or may preferably be a bundle of filaments arranged in substantially flat ribbon form as is readily commercially available in the form of ribbons or bundles of fiberglass (commonly called rovings) or the like, such ribbons or bundles having various known applications aside from the applications which are being described herein.

The sources 130 and 132 are respectively associated with tension control motors 136 and 138 with which are respectively associated cables 140 and 142 connected to a tension controller 144. Tension controller 144 is essentially a variable source of voltage which applies a field voltage or the like to motors 136 and 138 thereby to control the tension applied to the ribbon or filament coming from the sources 130 and 132. This resulting tension prestresses the ribbon incorporated into the respective windings thereby to control the final tension of the filaments on the mandrel. Other means of tension control and braking can also be used.

The filament arrangement 134 proceeds through guide rollers 150 and 152 passing therebetween tangentially along a filament speed compensator roller 154 controlled by a cam 156 operating in conjunction with a cam follower 158. The cam 156 is connected by a shaft 160 to a transmission gear 162 connected, in turn, through a series of gears 164, 166 and 168 to a motor 170 to be discussed in further detail hereinbelow.

The provision of the cam 156 operating in conjunction with cam follower 158 and roller 154 enables precise adjustment and control of the speed of feed of the filament arrangement 134 thereby enabling compensation for speed changes required to maintain a constant velocity of the filaments being wound on the mandrel 20. The velocity of the filament at 178 is not uniform due to the shape of the mandrel which is flat. (With a round mandrel this velocity would be constant or uniform for example.) By adding or substracting velocity with 154, 158 and 156 it is possible for source 132 to feed 134 at a more constant velocity.

Attached to a gear 164 is a threaded shaft 172 bearing thereon a cross side 174 attached to a fixture 176. The fixture 176 supports the roller 152 and the cross slide 174 supports the feed eye 178 through which the filament or filament arrangment passes on its way to the rotating mandrel 20. Rotation of the shaft 172 enables rectilinear displacement of the cross slide 174 and the fixture 176 attached thereto according to the speed generated by the motor 170 and effective through the gears 168, 166 amd 164 in that sequence.

The mandrel 20 tool is engaged between the tail stock holder 180 and the head stock holder 182 which cooperatively constitute a holder for the mandrel 20. The tail stock mandrel holder 180 is connected to the tail stock 184 mounted on the slide 186 to which it is locked or from which it is released by means of control handle 188. This enable the grasping and releasing of the mandrel 20 so that the mandrel can be rotated ninety degrees as between the illustrated axes can be rotated ninety degrees as between the illustrated axes X and Y so that helices can be wound on the tool 20 in substantially perpendicular relationship as has been discussed hereinabove.

The head stock mandrel holder 182 is connected to and driven by the motor 170. Thus, the rotation of the mandrel 20 and the rotations of the elements 160 and 172 are all related and in direct proportion to the size and tooth configuration of the gears 162, 164, 166 and 168. Thereby, the pitch of each helix may be appropriately selected and precisely controlled with the helix forming filament or filament arrangements being placed under tension under the control of tension control motors 136 and 138 as controlled, in turn, by tension controller 144 mentioned hereinabove.

Figure 10:
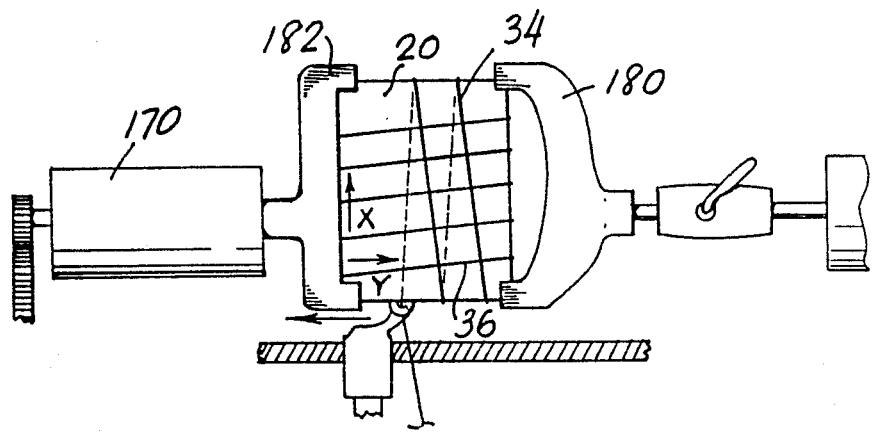
FIG. 10 shows a portion of the apparatus with the mandrel thereof modified in posture to enable the winding of a second helix thereupon.

FIG. 10 illustrates the rotation of the mandrel 20 as located in FIG. 9 so that the X axis becomes the Y axis and vice versa, thereby enabling the winding of the respectively different helices 34 and 36 as previously discussed relative to FIGS. 1, 3, 7 and 8 hereinabove. In all other respects, the rotation of the mandrel 20 is controlled by the motor 170 operating through the various associated elements all as has been discussed hereinabove with respect to FIG. 9.

Figure 11A:
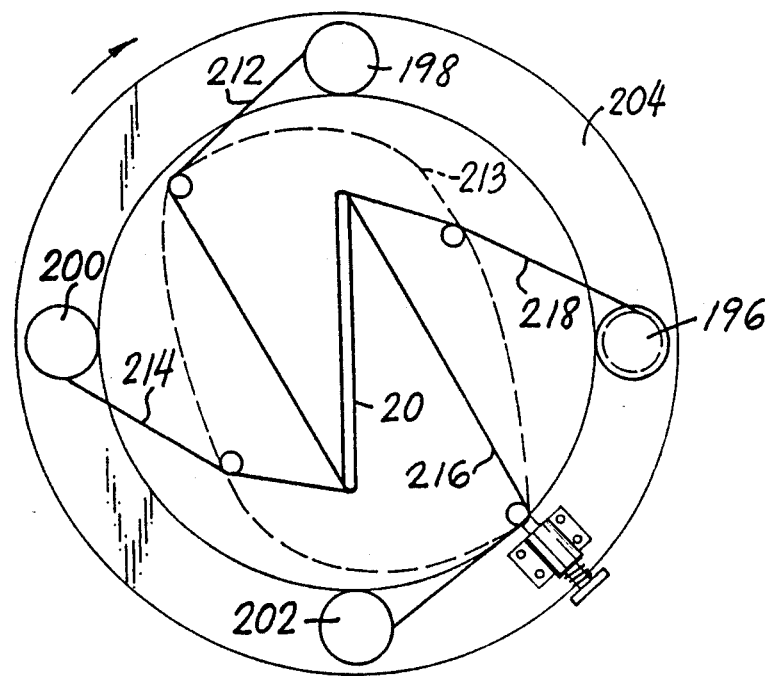
FIG. 11A diagrammatically illustrates the supply of filament by means of a planetary arrangement.
Figure 11B:
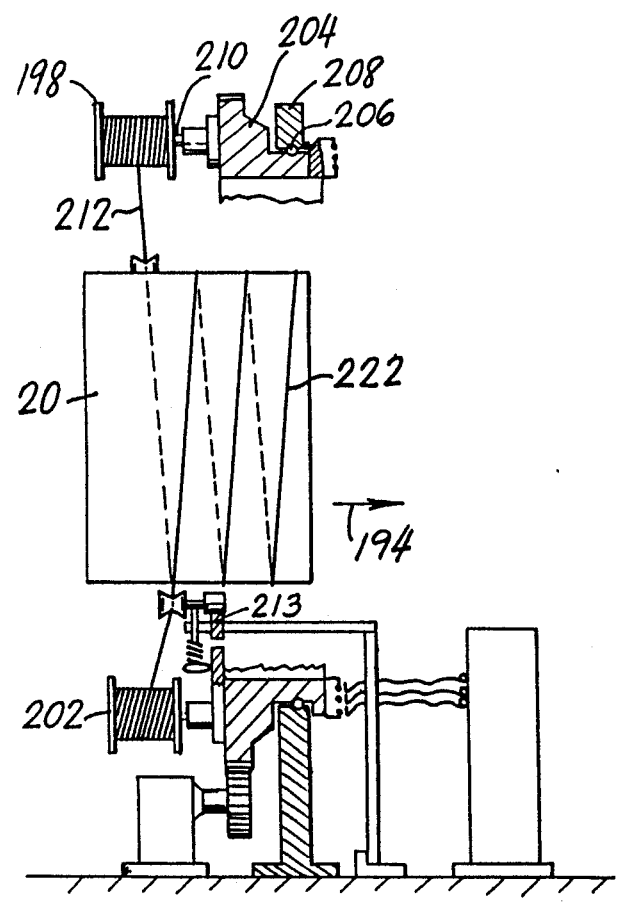
FIG. 11B illustrates the arrangement of FIG. 11A from a different vantage point and in greater detail.

The illustration of FIGS. 9 and 10 represent one form of practicing a method of the invention only. As has been noted elsewhere herein, there are other methods of practicing the techniques of the invention and one of these is illustrated in FIGS. 11A and 11B. In these figures are again illustrated the mandrel 20. However, in this case the mandrel 20 is not rotated, although it can be rectilinearly displaced as shown, for example, by the arrow 194. In this form of apparatus, there are provided a plurality of sources of filament of filament arrangements. These sources are indicated at 196, 198, 200 and 202. These sources are mounted on a turntable 204 mounted by bearings 206 on a support 208. The turntable 204 permits the displacement of the sources 196, 198, 500 and 202 in planetary manner and in a direction which encircles the mandrel 20. In other words, these sources revolve in planetary fashion around the mandrel 20 constituting the sun around which the planets move in regular manner at constant speed. It will be observed that the sources are in effect individual spools capable of rotating on respective axes such as indicated, for example, at 210 so that the filament or filament arrangment 212 (or 214, 216 or 218) may be wound in helical form on the mandrel 20 for a helix such as, for example, indicated at 122. Once again, the mandrel can be shifted ninety degrees to form the desired helices in their perpendicular relationship. Thus, it will be appreciated that while a relative motion is provided as between the mandrel and the associated source or sources, this relative movement may be effected by rotating the mandrel and holding the source or sources relatively constant or vice versa. It will also be understood that in an appropriate situation movements of both of these categories of elements may be simultaneously applied in order to achieve the desired result.

Other methods include the use of beams to apply whole layers of parallel filaments or yarn as shown in FIGS. 11C, D, E, and F. These layers can be applied as parallel strands 201 from a source 203 to a position about a mandrel 205 (FIG. 11C) and then are gripped and cut by implement 207 as shown in FIG. 11D and the mandrel processed as hereafter stated. The layers can also be applied to a frame and gripped and cut. The frame can then be processed as hereafter described. The layer thus fabricated is perpendicularly displaced relative to source 203 as appears in FIG. 11E and gripped by additional implement 209 as appears in FIG. 11F.

The difference is that with the mandrel one would get two laminates (i.e., one of each side of the mandrel). With the frame, one would only get one laminate at a molding cycle.

In addition to the above, suitable frames can be placed about a round or other suitably shaped mandrel and each layer can be formed using standard filament winding methods. The frames can be sequenced in positions such that the X or Y axis is parallel or perpendicular to the winding. After each full layer, the end would be fixed to the frame and the filaments cut and the frame shifted ninety degrees and the next layer applied. This can then be molded as described hereinabove.

FIGS. 12–16 illustrate generally one form of apparatus for applying resin to the thusly wound helices. Therein will be seen a vat or tank or chamber 240 within which is accommodated a bath 242 for a liquid resin 244. A vacuum pump 246 is attached by a tube 248 through a trap 250 and a further pipe 252 via opening 254 to the internal space 256 of the chamber 240. A top 258 is supported on annular flange 260 of chamber 240 by means of an O-ring 262 which provides an appropriate seal. An opening 264 admits of a mandrel holder rod 266 passing therethrough. This rod supports a clamp 268 holding the mandrel 20 with the windings mounted thereupon. An O-ring 265 forms a seal between rod 266 and top 258.

Figure 12:
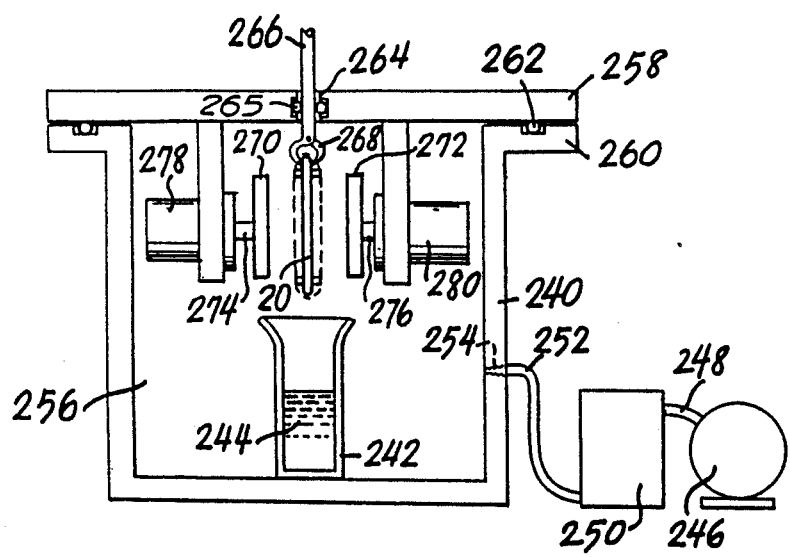
FIG. 12 diagrammatically illustrates a portion of a preferred apparatus of the invention for the application of resin to constitute a matrix.

Straddling the mandrel in its position as illustrated in FIG. 12 are molding or outer plates 270 and 272. These plates are connected to piston rods 274 and 276 in turn controlled by piston and cylinder assemblies 278 and 280. The purpose of this arrangment will be explained in great detail hereinbelow.

Figure 13:
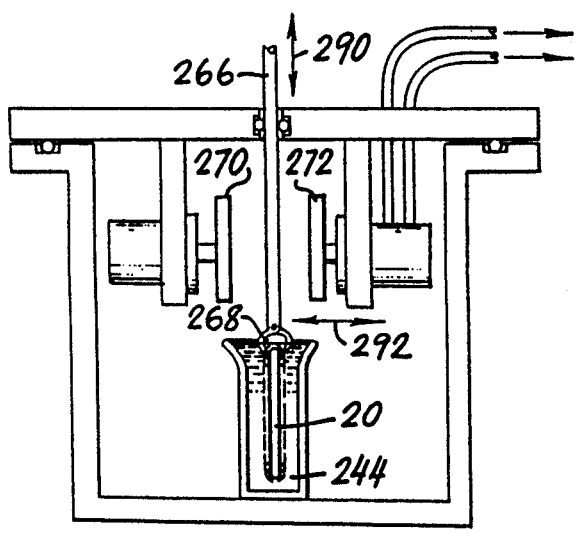
FIG. 13 illustrates the apparatus for FIG. 12 with a wound mandrel immersed in a bath of resin.

FIG. 13 illustrates substantially the same elements as have been described hereinabove with respeact to FIG. 12. However, this figure shows that the rod 266 has been displaced downward as indicated by arrow 290. Arrow 292 illustrates the direction in which plates 270 and 272 can be themselves displaced. With the rod 266 and the clamp 268 in the position illustrated in FIG. 13, the mandrel 20 is completely immersed in the bath 244 along with the helical winding thereupon. Due to the application of vacuum as effected by use of the pump 246, a thorough penetration of the resin into the intermediate product is assured.

Figure 14:
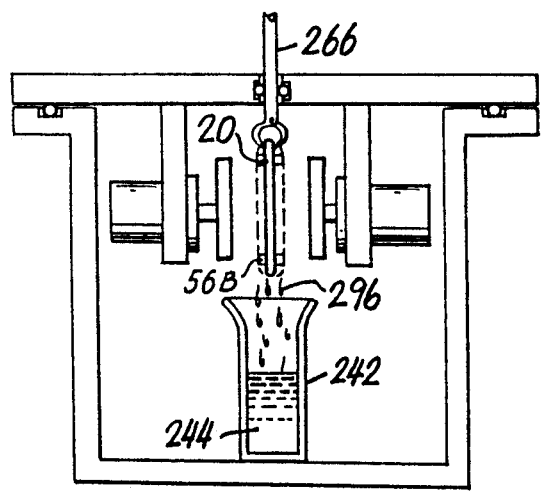
FIG. 14 illustrates the apparatus of FIGS. 12 and 13 with the coated wound mandrel withdrawn from the bath of resin.

According to FIG. 14 the rod 266 is then displaced upward thereby removing the mandrel 20 from the bath 244. Drainage then takes place, as indicated by the drops 296. Thereby, some of the excess resin is allowed to drain back into the container 242. Some excess resin remains covering and around the outside of the windings due to the thixotropy of the resin formulation.

Figure 15:
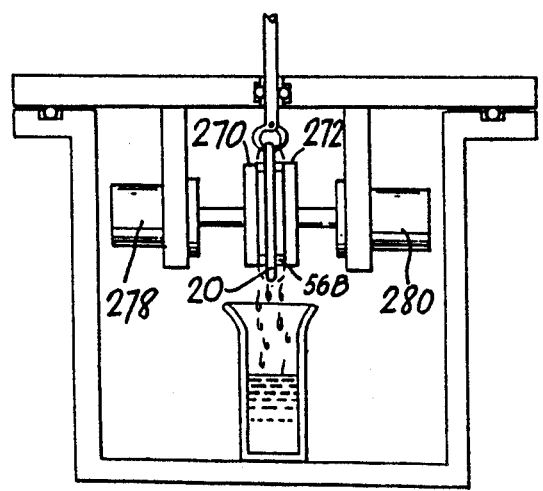
FIG. 15 illustrates the closing of the outer plates to stops and to the resin-impregnated product in the apparatus of FIGS. 12, 13 and 14.

According to FIG. 15, operation of the piston and cylinder arrangements 278 and 280 bring the plates 270 and 272 against the stops 56B on the mandrel 20. The stops will determine the exact thickness of the resulting laminated product. All the windings and the resin will be included in that thickness. Because a liquid system is used, very little pressure is required to close the mold. After the mold is closed the vacuum can be released.

Figure 16:
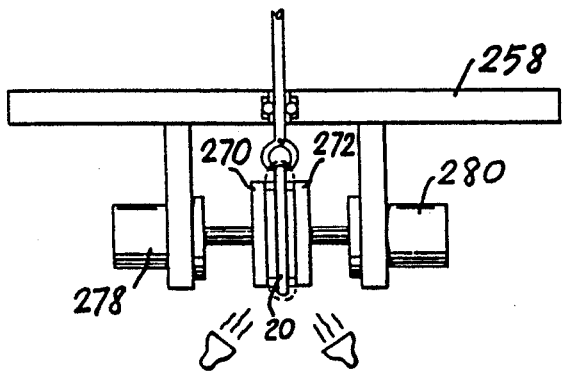
FIG. 16 illustrates the final cure of the product of FIGS. 12-15.

FIG. 16 illustrates the removal of the top cover 258 from the remainder of the associated apparatus thereby to enable exposure of the mandrel 20 and the windings thereon to the application of heat by any one of a variety of techniques inclusive of, but not limited to, radiation, conduction, and convection techniques and/or the use of microwave heating and the various other types of heating which have been mentioned hereinabove. The plates 270 and 272 are thereby opened and the mandrel 20 and product removed. The laminate is trimmed with respect to the edges and removed from the mandrel and the finished laminate is trimmed out of the intermediate product which has been thusly formed, all as has been described hereinabove.

Figures 17A, 17B:
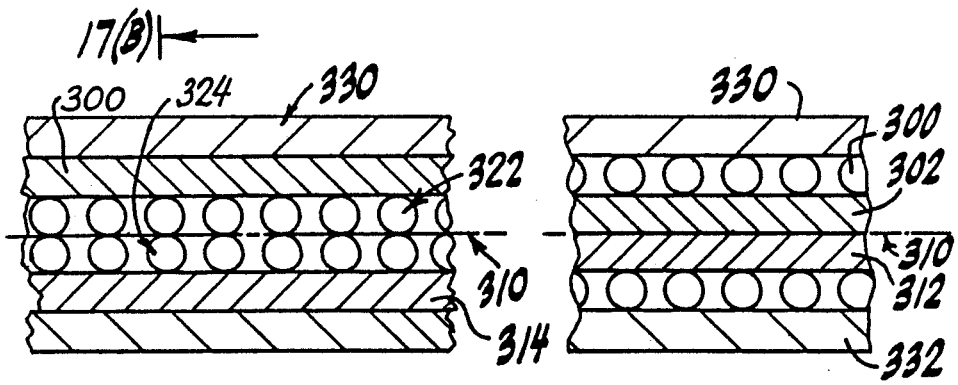
FIGS. 17A and 17B diagrammatically illustrate, in perpendicularly related sectional view, partially broken away, a product of the invention.
Figure 18:
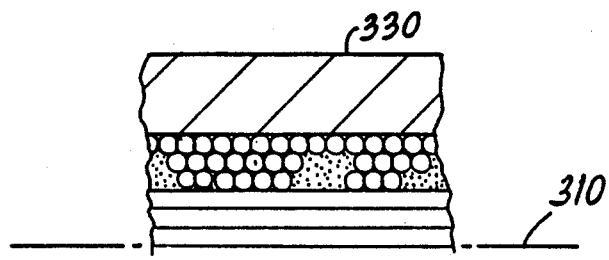
FIG. 18 diagrammatically illustrates a section of the product of FIG. 17 on enlarged scale.

FIGS. 17A and 17B illustrate (as respective perpendicularly related sections) one possible finished product in which there are a plurality of layers such as indicated at 300, and 302, on one side of the plane of symmetry indicated at 310. On the other side of the plane of symmetry are indicated layers 312, and 314. The filament sections 322 and 324 of layers 302 and 312 on opposite sides of the plane of symmetry 310 are parallel to each other and are aligned with one another. These filament sections are, as are the filament sections of the outer layers, regularly and uniformly spaced and embedded in a matrix as described above. Electrically conductive coatings are indicated at 330 and 332. FIG. 18 shows a section of FIG. 17B on enlarge scale. In this view, the structure of roving R is seen. It will be appreciated that voids may be left in the filamentary layer through the product illustrated in FIG. 17. These may be filled with resin matrix or left unfilled with proper tooling. The holes can be drilled, reamed or punched to provide a hole for plating or riveting or other means of connecting the circuits of one surface with the circuits of the other surface.

The above described techniques of the invention envisage a removable mandrel. Another embodiment of the invention includes the formation of the laminate around a core or mandrel which is maintained in position and which may be used as a heat sink, ground connection, or power plane and perhaps also to control thermal expansion. In this form of the invention the mandrel can be formed of metal or from metal-clad laminates. Copper-Invar constitutes one alloy being used as a heat sink and as a thermal expansion matching core for ceramic based chips. The mandrel can also be arranged for removal to leave an opening which forms a duct or the like.

The nature and type of filamentary material which serves as a reinforcement in the matrix of the invention has been referred to hereinabove. This filamentary material may preferably be of untwisted type, but could be of twisted or piled yarn type. Other types of reinforcement are also possible but make it substantially more difficult to control the uniformity of thermal coefficient of expansion as well as modulus of elasticity. It also would make the control of warping and the avoidance thereof more difficult. As has been indicated, the filaments may be applied as single individual filaments or may be applied as bundles or ribbons of multiple parallel filament which are commercially available.

the method of the invention may generally be considered in a preferred embodiment to be a method of making a laminate board comprising the steps of winding a first layer of tensioned untwisted filaments in parallel spaced relationship and thereafter winding a second layer of tensioned untwisted filaments in a parallel spaced relationship at an angle to the first indicated set and then sequentially winding succeeding sets of untwisted tensioned filaments over the first mentioned layers described hereinabove. The filaments are then impregnated with a resin and the resin is cured. The first set mentioned above is uniformly disposed about a first axis and the second set is uniformly disposed about a second axis which is transverse to the first axis.

In accordance with the invention the mandrel is provided with a disposably rim which is removed along with the edge portion of the resulting helices thereby to divide the helices in entirety into two separate portions whereof the remaining filament sections are parallel and uniformaly distributed preferably perpendicular to the edges of the resulting laminate.

While certain procedures have been indicated above, it is possible for certain unique applications to employ a continuous belt as set forth in U.S. Pat. No. 3,537,937. It is desirable in all events and circumstances that the number of filament sections be the same in both directions of posture within the laminate or laminates and that all layers appear as mirror images about the center plane or plane of symmetry of the intermediate and final product. The layers of reinforcements or filaments are usually preferably so arranged as to give an equal flexural modulus of elasticity or section modulus in the X and Y directions. However, it is possible to design different flexural moduli or section modulus in the X and Y direction where needed. This presupposes an ability to change density or pitch of winding. In any event, it is preferred that the resulting winding end up with all filaments or filament sections at an equal tension and equally spaced.

The tension value must be such at gelation temperatures that when reduced to ambient temperature, the strains induced by the tension in the reinforcement, the shrinkage of the resin, and the expansion/contraction of both due to temperature, balance so as not to induce a stress in the laminate that is greater than the critical buckling stess.

Under certain conditions but not to be considered as preferred there might be incorporated into the intermediate or finished product layers of cloth filaments or non-woven materials as used in the previously known techniques. The incorporation of the layers of cloth filaments will make it much more difficult to control uniformity of characteristics as is considered essential in accordance with the teachings of the invention.

In the application of metal or conductive coatings, the use has been indicated for foil or plating mandrel and/or outer plate surfaces (see outer plates 270 and 272 in FIG. 12). As has been mentioned herein the plating can be formed or configured as electrical circuitry. This may be effected by photoplacing or screen printing of a negative resist and other such techniques. In two alternative techniques the resist can be removed and then the laminate formed so as to generate a laminate with a circuit completely embedded therein and perhaps with a copper surface flush thereupon. In another technique the resist can be left in position and a mold release applied thereto (if the resist does not have release properties built in) and then the laminate formed. Copper can be applied by electroplating and other techniques. The copper can be burnished to improve grain structure. The copper may also be machined or ground to predetermined thickness. In addition, the copper can be plated with zinc or nickel and/or chemically treated to form oxides if desired so as to form a better bond to the resin of the laminate. An adhesive layer can be applied to the copper for improving the peel strength of the copper and to constitute a barrier for the filaments to resist etching chemicals and other corrosives.

The filaments can be impregnated by a solvent solution of regin either before or during winding, and the solvent may be flashed off. The resist may b e partially cured and after winding can be vacuum impregnated as illustrated in FIGS. 12–16. This technique may be useful in order to hold the filaments in the proper position for impregnation with some reinforcement resin combinations. It is also a method for applying two different but compatible resin systems, one surrounding the glass and the other filling the interstices. This could be preferable with some resin systems.

In accordance with the invention the laminates can be provided with positioning holes and are stacked by the use of locating pins as according to known techniques in the production of multilayer boards. The assembly can be placed in a suitable potting assembly and the outer plates 270 and 272 employed to compress the assembly together.

In the current state of the art, multilayer P.C.B.'s (printed circuit boards) are produced using one or more one or two sided P.C.B.'s, two or more groups of fabric impregnated wih resin, i.e. prepreg, and two outer conductive layers usually copper foil. As an example, an eight layer board would be made by assembling three two sided P.C.B.'s separated by and covered by four layers of plies of pre-impregnated fabric, (i.e., prepreg) and faced on both sides by two sheets of copper foil. These assemblies would be faced with two steel separator plates to form a book. A number of these assemblies could be stacked and placed between two outer steel plates and this assembly would be placed in a press and cured under heat and pressure.

The alignment or registration of the six circuits on the three two sided P.C.B. 's is usually maintained by using steel locating pins that pass through suitably located and drilled holes in all of the material and the separator plates. The holes in the three P.C.B.'s and the separator plates are located and drilled under tight tolerances while the holes in the prepreg and copper foil can be clearance holes.

It is important that the registration of all the lines in all six of the inner circuits be maintained, because in finishing the board, holes are drilled through the board and these holes are plated in order to make electrical connections between lines in the various circuits included in the board. If the lines are not accurately located, the plating through holes operation can result in open or short circuits causing rejection of the multilayer board.

There are a number of possible causes for the circuits being out of registration. One is that during processing of the inner P.C.B. boards, they are exposed to etching, plating. washing, oxidizing solutions and so forth. These solutions can cause the resin matrix in the board to absorb water and chemicals and attempt to increase in size or change the boards dimensionally. Unfortunately, the boards do not change dimensions uniformly one board to another.

Another cause of loss of registration is caused by the heat and pressure used in the multilayer board laminating process described above. The copper lines which are perhaps 0.006 inch wide and 0.0014 inch high are subjected to hundreds of psi pressure and cure temperatures of 200 plus degrees F. Actually since the copper covers only about one-third the surface on either side of the board and the copper is raised above the surface of the board as are the opposing face of the next board, there is a tendency to multiply the pressure force on the copper by dividing the total psi by the projected area of the copper or in the average about one/third for a pressure multiplier of three. This is exacerbated by adjacent and opposing circuits bein non-uniform so that if one considers only the projected areas of opposing copper faces supporting the pressure, the pressure multipliers get larger. Also since the heat causes the resin in the prepreg to re-liquify, the pressure is hydraulic and is applied not only normal to the P.C.B boards, but also parallel to the surface of the boards or in a direction tending to move the 0.006 inch lines. This also occurs at a time when the bond of the conductive copper to the board matrix is weakened due to high temperature. Thus the lines can be moved and registration of the circuit lost.

Another problem lies in filling the corner formed between the board surface and the side of the conductor lines. Since, when the interior P.C.B 's are stacked up with the prepreg at ambient, the space between conductors is completely void of material. The conductors are mounted on the P.C.B. surface and the prepreg rests on the top of the conductors and the space between is void of material.

The current state of the art depends on the flow of the resin from the prepreg when heated prior to cure, to fill the voids. Some of the newer art puts the area of the press under vacuum to help remove some of the trapped air and better fill the voids. Still others use vacuum bag and autoclave molding techniques to attempt to remove the air and apply uniform pressure during cure.

It is an object of the present invention to eliminate both problems in the current state of the art in the production of multilayer circuit boards; namely the hydraulic pressure which can cause the conductor lines to move, and the tendency of air or voids to form on the sides of the conductor lines.

FIG. 19A shows a two-sided P.C.B board 400 which has been prepared to be laminated into a multilayer circuit board. In accordance with this aspect of the invention, the board is covered with the desired number of layers of filaments using equipment as described with respect to FIGS. 7, 9, 10 and 11. Alternatively, layer(s) of fabric treated with a finish compatible with the resin system being used can be applied or tacked to both sides of the P.C.B. board. Board 400 may be provided perimetrally with spacer frames 401 (a)–(d).

Figure 19B:
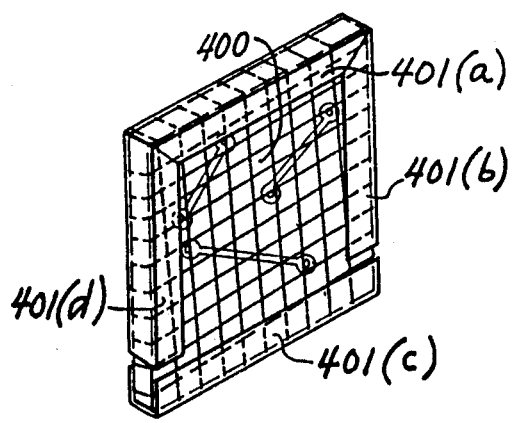
Figure 19B:
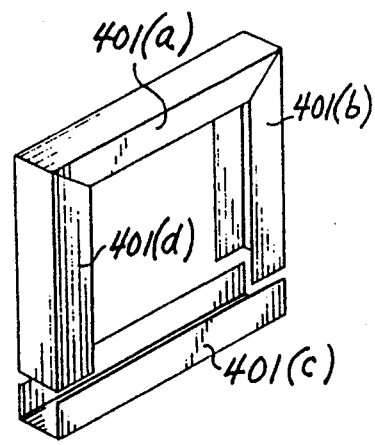
Figure 19B:
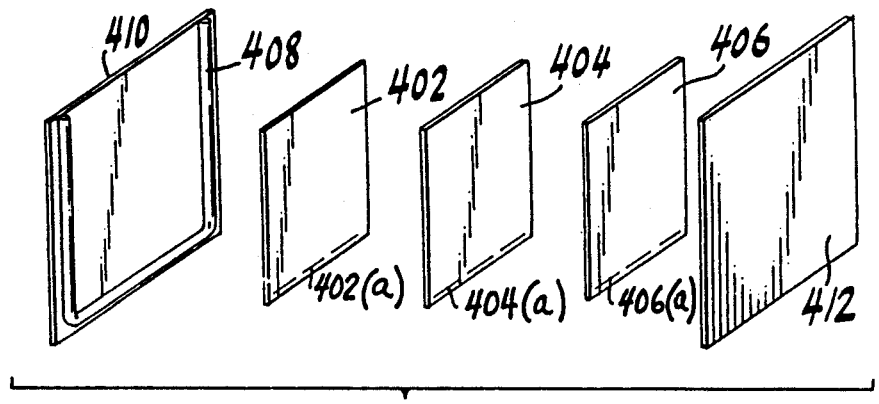

FIG. 19B is an exploded view of the assembly that is put through the process of this invention. The illustration shows an eight layer board, six layers from the two sides of three inner P.C.B. boards 402, 404 and 406 plus two layers of copper which are added to form the outside surfaces of the multilayer board. It also shows a perimetral elastomeric gasket 408 used to contain the resin formulation between the outer plates 410 ane 412.

The three inner P.C. boards are held in registration and with proper spacing with each other at the bottom areas 402(a), 404(a), and 406(a) between the dotted lines and the bottoms of the board either by tack bonding, riveting or some other such means. Proper registration can be achieved using optical means lining up suitable targets included on each of the boards. Proper spacing can be achieved using suitable shim material as an alternative to or in addition to spacer 401(a)-(d).

FIG. 19C1 shows a spreader block 414 in raised position. The action it places on the assembly in its lowered position is shown in FIG. 19C2 wherein block 414 increases the spacing between the P.C.B.'s and between the P.C.B.'s and outer plates. In the raised or upper position (FIG. 19C1), block 414 is disengaged and the elements are at their designed spacing, compensated for shrinkage if necessary. The spacer frames shown in FIG. 19C3 or the like can be used.

FIG. 19D shows the fingers 416 of the spacer block 414 in enlarged view. Each finger is tapered for spreading the elements to allow rapid and effective penetration of the resin formulation between the various parts as will next be discussed.

As shown in FIG. 20A, the assembly is placed in a suitable vacuum chamber 420. The spacer block 414 is in its lowered position and acts to spread the components apart form each other at the top. The gasket 408 is of such diameter and is initially under compression as to retain the outer plates in sealed relation on three sides, (right, left and bottom) to form a container or chamber for the assembly. The chamber is open upwardly to receive the resin which will be used later. This upper opening is only partly obstructed by block 414. The chamber is then evacuated to the preferred vacuum of approximately 2 mm. mercury or less.

Figure 20B:
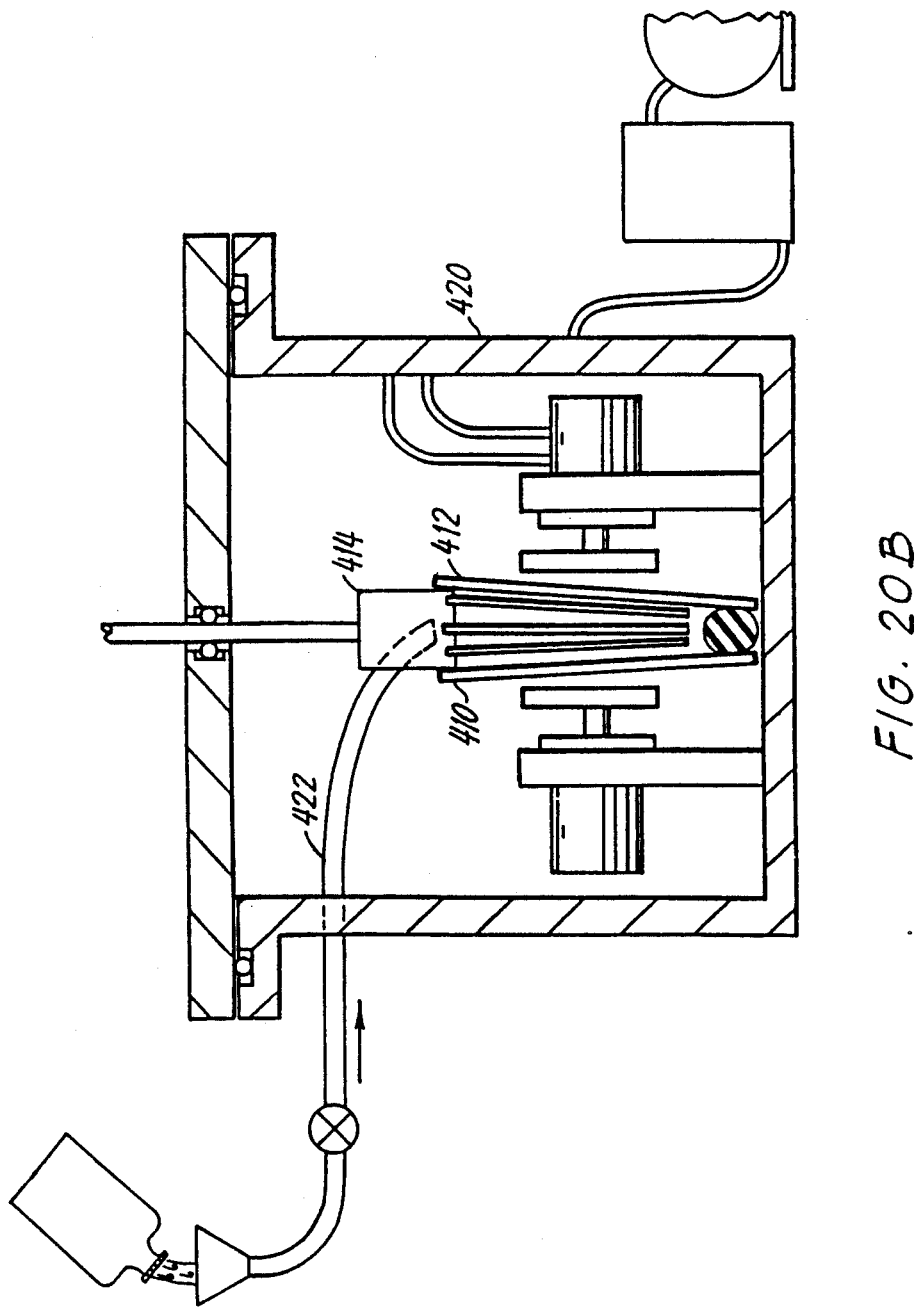
FIGS. 20A-D diagrammatically illustrates a method and apparatus for producing the multilayer board of FIG. 8B using the assembly of FIGS. 19A-19D.
Figure 20:
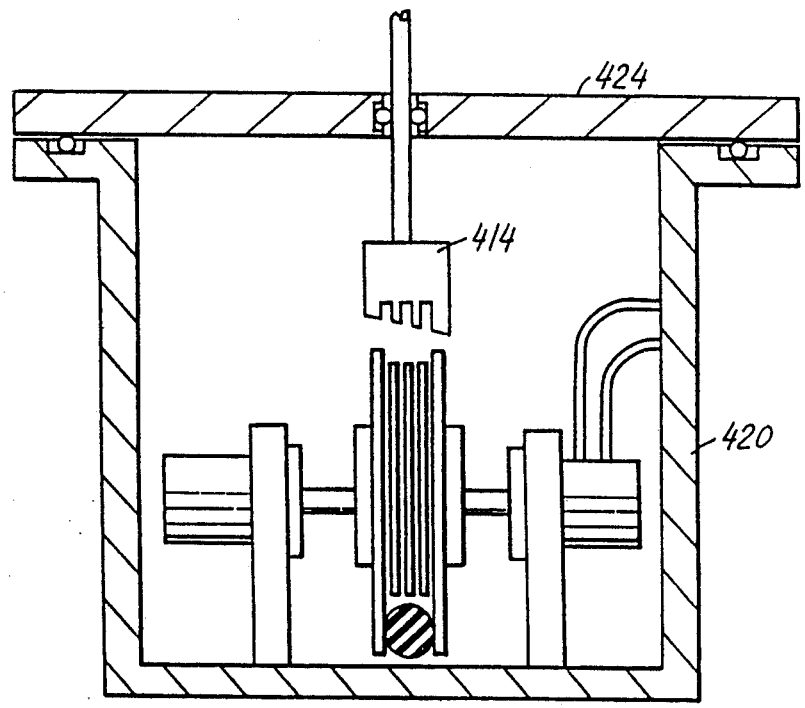

As shown in FIG. 20B, while the chamber is still under vacuum, the resin formulation is injected via line 422 into the container from between the two outer plates 410 and 412 and the elastomeric gasket. The quantity of resin should be such that, when the assembly is subsequently closed to the design spacing, the resin level should be at least above the top of the inner P.C.B.'s 402, 404 and 406 and reinforcement wound or tacked thereto. The assembly should remain as shown for a sufficient time to allow any frothing to dissipate and for resin to fill all interstices.

As shown in FIG. 20C, the spacer block 414 is subsequently raised and the cylinders activated to close thee assembly to the designed spacing. When the assembly reaches this spacing as controlled, for example, by spacers 401(a)-(d) and other shims, etc., the vacuum can be released.

Figure 20D:
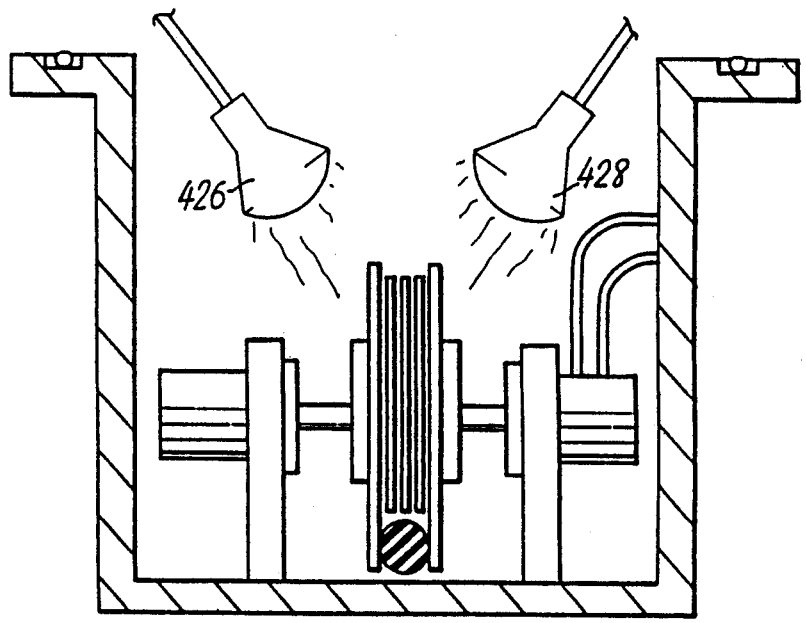

As shown in FIG. 20D, the top 424 of the chamber 420 is removed and the assembly heated to effect a cure of the resin. Lamps 426 and 428 are illustrated by way of example but various other heating techniques are readily possible. The assembly can be post-cured if necessary and the outer plates 410 and 412 and gasket 408 are removed. The product can then be trimmed and, in the trimming process, spacers 401(a)-(d) can be removed if so desired.

This process of the invention eliminates two major problems with respect to the current state of the art. There are no pressure or hydraulic forces tending to move the conductor lines. Significantly, by the use of the vacuum impregnation technique, all of the interstices are filled with resin and there are no voids or entraped gases. In additon, there are many other advantages. For example, the need for a press, vacuum press, or vacuum bag autoclave is eliminated. Moreover, the molding cycle is much simpler and easier to control because the rheology problems with the prepreg are eliminated. Additionally, a broader spectrum of resin systems can be used since pre-preggability and storage are eliminated as requirements. Solvent systems and their inherent contaminating and toxic problems are eliminated.

The process of the present invention gives great latitude and control of the ratio of reinforcement-to-resin content of P.C.B.'s. The ratio of volume reinforcement to resin can vary from approximately 0 to approximately 0.9 theoretically. The zero capability stems from the fact that it is possible to cast between the outer plates or between the outer plates and mandrel. These tool surfaces are held apart to the desired spacing (i.e., thickness) by stops. A seal is placed around the bottom and two sides to form a container for the resin. While not many applications are foreseen at this time for zero or very low ratios of reinforcement to resin, there are some. One important one is explained below.

The reinforcement normally has a higher dielectric constant than the resin. But the resin will absorb water, whereas the reinforcements do not absorb water (except for the organic type). The thermal coefficient of expansion of the reinforcements are at least an order of magnitude less than the resin.

| Example | Dielectric Const. | T.C.E.(PPM/°C.) |
|---|---|---|
| E Fiberglass | 6.3-6.8 | 4.8-5.4 |
| D Fiberglass | 3.85 | 2.0-3.0 |
| S Fiberglass | 5.0-5.3 | 2.3-2.8 |
| Quartz | 3.35 | 0.54 |
| Aramid | 4.1 | −2-4 (Axial) |
|  |  | 56 (Radial) |
| Epoxy Resin | 3.3 | 30-80 |

It is determinable (but not linearly so) that the followig holds true:

As the reinforcement to resin ratio increases:
Dielectric constant increases
Water absorption decreases making laminate more dimensionally stable through etching, plating, and other such processing.
T.C.E. (Thermal Coefficient of Expansion) decreases
The relevant industry normally prefers:
1. Low or minimum dielectric constant
2. Maximum dimensional stability through processing which means low water absorption mostly.
3. A T.C.E. that matches the T.C.E. of I.C. chip carriers ($\sim 5\text{-}7 \times 10^{-6}$/Deg.C).
4. Control with repeatability The reasons for this are:
1. Electronic signal speed through a conductor is inversely proportional to the square root of the dielectric constant of the dielectric surrounding the conductor. Low D.C. and uniform D.C. one board to the next are usually desirable.
2. The dimensional stability is needed for the inner P.C.B.'s that go into multilayer boards (M.L.B.'s). These boards go through printing, etching, and plating processes prior to being laminated in a M.L.B under heat and pressure. The dimensional stability of these boards determines the relationship of the registration of the circuits on these boards one to the other. This is important because of the subsequent drilling and plating-through holes-operations on the M.L.B. that are used to make electrical connections with specific conductors on the internal P.C.B.'s. Internal conductors and/or spaces that are out of alignment can cause open or short cirucits in an M.L.B., which are cause for rejection. Thus, dimensional stability is one of the limiting factors in the way of densifying circuitry through the use of thinner lines and thinner spaces.

The preferred T.C.E. of the M.L.B. is one that matches the T.C.E of the chip carrier which is mounted directly on the surface of the M.L.B. In this manner, the stress on the bond of the chip to the surface is minimized during hot and cold temperature cycling.

One of the design schemes that is approachable in the present invention and not in the prior state of the art is next described. The overall reinforcement-to-resin ratio of an M.L.B. is selected with consideration to dielectric constant and T.C.E. This ratio is used as an average and is achieved by designing a high reinforcement-to-resin ratio in the interior printed circuit boards and a low reinforcement-to-resin ratio in the dielectric used between the P.C.B.'s. The high reinforcement/resins ratio of the interior P.C.B. will give it maximum dimensional stability for its processing. The lower ratio of the internal dielectric is then used to average out to the desired overall D.C. and T.C.E.

As stated above, the range of ratios of volume of reinforcement-to-volume to resin available to the product and process of this invention is theoretically from 0 to >0.90. In the laminate, the resin matrix is dimensionally most affected by water and chemical absorption and temperature. The resin component expands or wants to expand when it absorbs water or chemicals. The fiberglass reinforcement does not absorb water or chemicals and as a result wants to stay dimensionally the same. The materials, bonded together in the laminating process, reach equilibrium whereby the resin induces a tensile load in the fiberglass which then equals the compression load in the resin. The amount of movement is proportional to the amount of liquid absorbed by the resin, the percentage of resin per unit of laminate, and the modulus of elasticity of the resin all divided by the percentage of fiberglass per unit laminate and the modulus of elasticity of the fiberglass.

Products of this invention can have a much higher ratio of reinforcement to resin. This is due to geometry. In the C.T.L. construction, the reinforcement in each layer consists of essentially parallel rods or filaments. With the fabrics used in the previously known process, there is the over and under weave pattern which crimps the yarns which also are twisted. This by necessity leaves gaps of air which are displaced by the resin in the prepreg step, thus increasing the percentage of resin to a higher level increasing the susceptibility to instability. Crimped yarns also do not reinforce as effectively as do straight continuous filaments.

The mathematics of the laminates' T.C.E. is similar to the equilibrium equation described above. In this case, the equilibrium is achieved between the resin wanting to expand more, approximately $80 \times 10^{-6}$ unit length/unit length per degree C., and the reinforcement (such as "E" glass) which only wants to expand $5 \times 10^{-6}$ unit length/unit length per degree C. Therefore, a reduction in T.C.E. results from an increase in the percentage of reinforcement. The T.C.E. of the laminate can be approximated as follows:

$$K_1 \simeq \frac{K_r E_r A_r + K_g E_g A_g}{E_g A_g + E_r A_r}$$

wherein
$K_1$ = Thermal Coefficient of Expansion of the laminate
$K_r$ and $K_g$ = Thermal Coefficient of Expansion, resin and glass
$E_r$ & $E_g$ = Modulus of Elasticity, resin and glass
$A_r$ & $A_g$ = Volume % resin & Volume % Glass (r and g subscripts refer to resin and glass)

Figure 21:
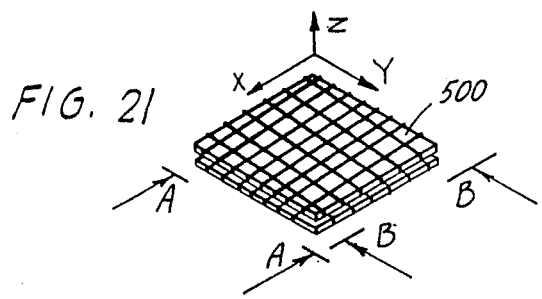
FIGS. 21A (X) and (Y)-21E (X) and (Y) show preferred structures prepared according to the method of the invention.
FIGS. 21F (X) and (Y)-21G (X) and (Y) show further structures which can be made by the method of the invention without achieving all of the benefits thereof.
Figure 21A:
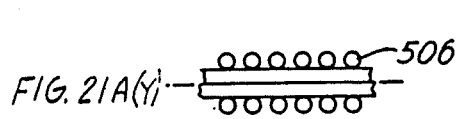
Figure 21B:
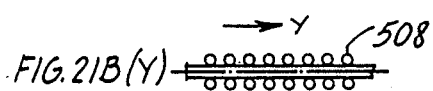
Figure 21C:

FIG. 21 illustrates various patterns of construction that can be wound with the method of producing P.C.B. laminates in accordance with the invention. Certain of these constructions are much less stable than others. For example, the structures of FIG. 20F & G will warp at ambient temperature and are not preferred structures. In any event, a two-layer laminate 502 as in FIG. 21F is too unstable warp-wise to be a satisfactory laminate for P.C.B.'s as is the laminate 504 in FIG. 21G. Thus, these are not preferred embodiments of the invention although some usages may appear for the same.

The answer is to make a laminate that is a mirror image about the neutral axis and the neutral axis should be on a plane of symmetry located in the center of the laminate. Constructions 506, 508, 510, 512, and 514 as in FIGS. 21A, B, C, D, and E meet this requirement as can many other constructions. The requirement is that starting at any point in the center or mid-plane of the laminate and going perpendicular to that plane or in the Z direction, the view at value +Z should be the same as the view at −Z or a mirror image. FIG. 21 shows in general, the bases for the views in FIGS. 21A (X and Y), 21B (X and Y), 21C (X and Y), 21D (X and Y), 21E (X and Y), 21F (X and Y), and 21G (X and Y). It defines views A—A and B—B and directions X, Y and Z relative to a laminate 500.

In addition to the above mirror image requirement, there are other requirements of the process necessary to make a flat or warp free board as follows:

1. All the filaments aligned in the same direction should be at the same tension whether in the same plane or layer or in other layers with the filaments in a parallel alignment.

2. The tension in all the filaments at gelation should be at the minimum necessary to maintain alignment. The tension value at gelation must be such that after curing and reducing the temperature to ambient, the forces due to the tension in the reinforcement, the shrinkage of the resin and the relative contraction of both due to temperature, do not induce a stress in the laminate that is greater than the critical buckling stress.

3. The laminate must be heated uniformly during cure, and post cure. This is necessary to keep the shrinkage uniform throughout or at least from side to side about the neutral axis.

By using the same quantity of reinforcement in the X as in the Y direction, the T.C.E. should be the same in X as in the Y direction. This is possible in the method of the invention because the filaments lie flat and parallel as opposed to the under/over pattern of the warp and fill in fabric.

When the P.C.B.'s are used for surface mounted components, it is desirable that the T.C.E. in the X and Y direction be the same as it is in the component or the component carriers. This will induce the least amount of stress in the bond of the component or carrier to the P.C.B. when subjected to temperature cycling.

It is pointed out that the tensile strength in the X and Y direction would be proportional to the amount of reinforcement parallel to that direction. It follows that in balancing the reinforcement in the X and Y directions, the tensile stress capability is also balanced. If desired, any amount of mismatch of reinforcement and tensile capabilities can be designed and built into the product of this invention.

In order to get the same resistance to bending in the X and Y directions, if desired, one would have to design in the same section modulus in both directions. The patterns of FIG. 21A, B, and C will not be balanced, but would have a higher section modulus and resistance to bending of the X axis as opposed to the Y axis. The section modulus is roughly proportional to the cross sectional area of the reinforcement times the square of the distance to the neutral axis from the centroid of that area. Since the fibers parallel to the X axis are on the outside as opposed to the Y fibers being on the inside or closer to the neutral axis, the X section modulus is greater than the Y. All this is assuming the same number of fibers in both directions.

Figure 21D:
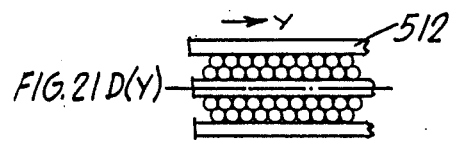
Figure 21E:
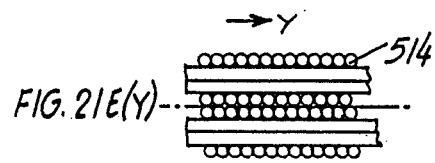
Figure 21F:
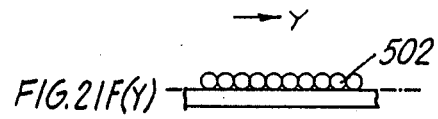
Figure 21G:
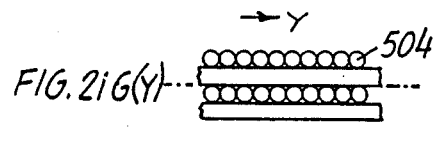
Figure 21A:
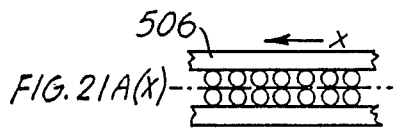
Figure 21B:
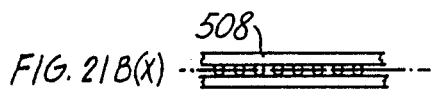
Figure 21C:
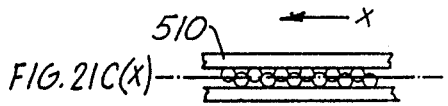
Figure 21D:
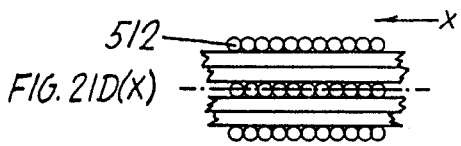
Figure 21E:
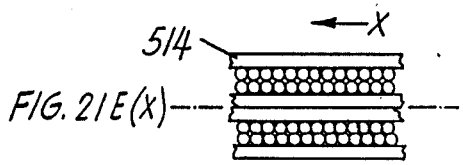
Figure 21F:
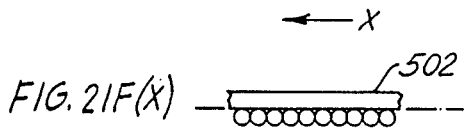
Figure 21G:
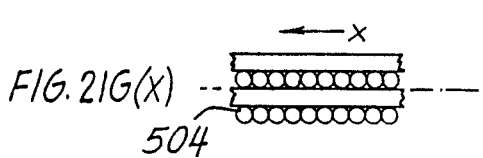

Assuming the same number of filaments in the X as in the Y direction and a desire for equal section modulus in X as in Y direction, then the warp free board designs such as in FIG. 21D and FIG. 21E are useful. Here the sum of the area of the fibers times the square of the distance of the centroid of that area from the neutral axis for both the X and Y directions are roughly equal. In a like manner, a tailored or controlled mismatch of X and Y section modulus can be incorporated into the laminate. This could be useful to save weight in certain board mounting designs.

FORMULATIONS

The process can use simplified formulations as compared to the current state of the art that uses prepreg. For example, in the case where epoxy resin systems are used; a typical formulation for the High Pressure Lamination with prepreg would be as follows:

| Varnish Formulation: | Parts |
| --- | --- |
| Dow D.E.R. 521-A80 epoxy resin | 125.0 |
| Dicyandiamide(Dicy) | 3.25 |
| Propylene Glycol Monomethyl Ether | 16.25 |
| Dimethyl Formamide(DMF) | 16.25 |
| Benzyldimethylamine(BDMA) accelerator | 0.25 |

The epoxy resin is a brominated epoxy solution containing 18 to 20% bromine by weight to impart fire retardance and 20% acetone solvent. To make a prepreg varnish, the curing agent (Dicy) which is a solid, must first be dissolved in the DMF and Propylene Glycol Monomethyl Ether because it has low solubility in organic solvents and epoxy resins. This low solubility of the Dicy can create unexpectedly high and erratic flows in the prepreg leading to high quality laminates being difficult or impossible to make. Also recrystallized or undissolved Dicy which comes into contact with the oxide treatment on the copper foil can cause voids and brown staining leading to defective printed circuit boards. All 4 solvents, acetone, propylene glycol monomethyl ether, and DMF must be removed or flashed-off during the prepreg operation after the cloth is impregnated with the varnish. The solvents are a cost problem and health hazard.

A formulation for the process and product envisaged in this invention would be as follows:

| Material | Parts |
| --- | --- |
| Dow D.E.R. 542 epoxy | 43.5 |
| Shell Epon 8280 epoxy | 21.0 |
| Methyl Tetrahydrophthalic Anhydride(MTHPA) | 35.5 |
| Benzyldimethylamine(BDMA) accelerator | 0.5 |

The Dow D.E.R. 542 is a brominated epoxy semi-solid which is combined with the liquid epoxy, Shell Epon 8280 and mixed with the BDMA and the liquid curing agent, MTHPA without the use of solvents of any kind to form the resin mix used in the vacuum impregnation molding of the said process.

The above resin formulation was used with Owens/-Corning Fiberglass 475-K1800 roving with an 1800 yards/pound yield in the process of this invention to make samples to compare with the current industry standard.

The industry standard is a material called FR-4. These samples were tested. The following table of test results shows data comparing the product of this invention with commercial products. The data is indicative of the increased efficiency of materials utilization designed to enhance product performance in the process of the invention.

Of particular interest is the series of three Moisture Absorption tests. The IPC has a committee called The Dimensional Stability Task Group that issued a report - IPC -483, Apr. 1984 entitled "Dimensional Stability Testing of Thin Laminates." In this test study report, the effect of moisture on dimensional stability was detailed. One of the conclusions was that the laminate expansion increased with higher relative humidity and the moisture content and expansion generally increased with higher resin content. The process of the invention can produce lower resin content thin laminates as well as more uniform and higher X - Y axis properties and thus provide a viable solution to this important industry problem.

| | COMPARATIVE TEST RESULTS | |
| --- | --- | --- |
| | PRESENT METHOD | PRIOR ART |
| FLEXURAL STRENGTH (AVE) | 100,300 PSI | 60-75,000 PSI |
| FLEXURAL MODULUS (AVE) | 3,438,000 PSI | 2,5-2,800,000 PSI |
| GLASS CONTENT, BY WT. | 63% | 58-60% |
| Tg (DSC) | 155 DEG. C. | 120-140 DEG. C. |
| MOSITURE ABSORPTION TESTS | | |
| 2 HR BOIL, DISTILLED WATER - | +0.075% | +0.15% |
| 2 HR BOIL + 24 HR 70 DEG. F. (COND 24/23) | +0.056% | +0.25% |
| 1 HR DISTILLED WATER - BOIL @ 15 PSI | +0.11% | +0.5% |
| SOLDER DIP-20 SEC. 500 DEG F. | PASSED | USUALLY FAILS |

| | COMPARATIVE TEST RESULTS | |
|---|---|---|
| | PRESENT METHOD | PRIOR ART |
| (After 1 hr 15 psi pressure cooker test) | | (Blisters & Delams) |
| ELECTRIC STRENGTH-Volts/Mil | 740 | 700–780 |
| DIELECTRIC CONSTANT @ 1 MHz | 4.54 | 4.55–5.0 |
| DISSIPATION FACTOR @ 1 MHz | .0094 | .0175–.020 |
| VOLUME RESISTIVITY, ohm-cm (550 volts, 24 hr, 70 Deg. F., 50% h) | $8.9 \times 10^{13}$ | $6 \times 10^{13}$ |

There will now be obvious to those skilled in the art many modifications and variations of the apparatus, methods and structures set forth hereinabove. These modifications and variations will not depart from the scope of the invention if defined by the following claims.

What is claimed is:

1. In a method for making a printed circuit board of a set of filament sections embedded in and bonded to a continuous phase of settable matrix material, the steps comprising, prior to setting or curing of such settable matrix material which holds the entire set of filament sections in fixed spatial relationship, forming at least one set of filament sections as a plurality of superposed layers of filament sections with the filament sections in each layer being arranged generally in the same direction and with the direction of the filament sections in at least one layer in such set being arranged at an angle to the direction of the filament sections in other layers in such set; and arranging said layers in mirror image relationship relative to a plane of symmetry parallel to the layers of the set, all of the filament sections aligned generally in the same direction being under the same tension; said filament sections being held on a form in fixed spatial relationship.

2. A method as claimed in claim 1 wherein all the filament sections in each layer are substantially parallel to each other, and said angle is substantially ninety degrees.

3. A method as claimed in claim 1 or 2 which further comprises winding the filament sections of each layer unidirectionally around a flat form at a tension sufficient to provide a uniform arrangement of the filament sections in each layer.

4. A method as claimed in claim 3 wherein the flat form is made to include a section in right quadrilateral shape and alternate layers are respectively wound in criss-cross directions on said form and are wound so that the number and character of filament sections in the respective directions provides substantially equal mechanical and thermal properties in such directions.

5. In a method for making a printed circuit board of a set of filament sections in a settable matrix, the steps comprising forming at least one set of filament sections on a form as a plurality of superposed layers of filament sections with the filament sections in each layer being arranged generally in the same direction and with the direction of the filament sections in at least one layer in such set being arranged at an angle to the direction of the filament sections in other layers in such set, and arranging said layers in mirror image relationship relative to a plane of symmetry parallel to the layers of the set, all of the filament sections aligned generally in the same direction being under the same tension on said form, wherein the filament sections are electrically non-conductive; and introducing a continuous settable matrix of electrically non-conductive material which, after setting, fixes the filament sections in position, the tension in the filament sections at the setting of the matrix being the minimum necessary to maintain alignment of the filament sections, wherein the filament sections are embedded in said matrix.

6. A method as claimed in claim 3 wherein the filament sections are embedded in a curable matrix of electrically non-conductive material which fixes the filament sections in position, and forming the matrix between said form and an outer plate.

7. A method as claimed in claim 1 wherein said layers are arranged in parallel planes.

8. A method as claimed in claim 3 wherein said form has opposite sides connected by edges and wherein sets are formed on opposite sides of the form, said filament arrangement being brought from one side to the other of said form by traversing said edges, said method including separating the sets by trimming the wound filament arrangement at the edges of the form.

9. A method as claimed in claim 3 wherein each filament arrangement is wetted, during the winding on the form, with a resin which is subsequently cured to form said matrix.

10. A method as claimed in claim 3 wherein each filament arrangement is completely wetted, subsequent to the winding on the form, with a resin which is subsequently cured to form said matrix.

11. A method as claimed in claim 3 wherein the filament sections are formed as bundles of filaments.

12. A method as claimed in claim 8 wherein the filament sections are helically wound by rotating the form.

13. A method as claimed in claim 8 wherein the filament sections are helically wound by revolving at least one planetary source of filament sections about said form.

14. A method as claimed in claim 8 wherein an angle between the form and the filament sections is controlled by relatively displacing the form and at least one source of the filament sections.

15. A method as claimed in claim 5 including forming a plurality of such sets and stacking the same to form said printed circuit board.

16. A method as claimed in claim 5 comprising forming a conductive surface or circuit on at least one of said layers.

17. A method as claimed in claim 1 wherein said filament sections are of a material selected from the group consisting of fiberglass, quartz, aramid, carbon, polyester and nylon.

18. A method as claimed in claim 5 wherein the matrix is a resin.

19. A method as claimed in claim 17 wherein the resin is selected from the group consisting of epoxy, polyimide, polyester, bismaleimide, vinyl ester, phenolic, melamine and polybutadiene.

20. In a method for making a printed circuit board of a set of filament sections in a continuous settable matrix, the steps comprising winding at least one set of filament sections as a plurality of superposed layers of filament sections with the filament sections in each layer being arranged generally in the same direction and with the direction of the filament sections in at least one layer in such set being arranged at an angle to the direction of the filament sections in other layers in such set; arranging said layers in mirror image relationship relative to a plane of symmetry parallel to the layers of the set, all of the filament sections aligned generally in the same direction being under the same tension; and maintaining substantially constant tension in the filament sections while winding said sections around a form such that all filament sections in each layer are substantially parallel and at the same tension.

21. A method as claimed in claim 8 comprising bordering said form with disposable edges which are removed when the filament arrangement is trimmed.

22. A method as claimed in claim 3 comprising controlling the pitch of the helically wound arrangement by controllably displacing said form.

23. A method as claimed in claim 1 comprising arranging an equal number of filament sections in each layer.

24. A method as claimed in claim 1 wherein the layers have respective X and Y directions which are perpendicular to each other and are arranged such that the resulting composite has an equal flexural modulus of elasticity in the X and Y directions.

25. A method as claimed in claim 5 wherein the matrix is of a curable substance and curing of said substance with the filament sections therein is effected under substantially atmospheric pressure.

26. A method as claimed in claim 5 which comprises forming a conductive surface on said composite by providing a metal on at least one side of one of the flat surfaces between which the matrix is formed, and transferring the metal to the adjacent matrix.

27. A method as claimed in claim 16 wherein the conductive surface is formed by providing a metal foil on at least one side of one of the flat surfaces between which the matrix is formed the metal being transferred to the immediately adjacent matrix.

28. A method as claimed in claim 26 wherein the conductive surface is formed by providing metal foil in the configuration of a circuit on at least one side of one said surface and transferring the circuit to the immediately adjacent matrix.

29. A method as claimed in claim 26 wherein the conductive surface is formed of metal which is subsequently burnished.

30. A method as claimed in claim 26 wherein the conductive surface is formed of metal which is ground to a predetermined thickness.

31. A method as claimed in claim 5 or 6 comprising forming outside surfaces on said matrix on opposite sides of the plane of symmetry, the surfaces being formed by said form on one side and by a flat surface on the other.

32. A method as claimed in claim 5 or 6 wherein the flat plate is brought into contact with the matrix after the filament sections have been vacuum impregnated with a curable resin constituting the matrix and while the resin is still under vacuum conditions.

33. A method as claimed in claim 31 wherein the spacing between the form and the flate plates is set to control the desired thickness of the composite.

34. A method as claimed in claim 33 wherein said spacing is set by spacers located in areas of both said form and flat plate wherein no filament sections are located.

35. A method as claimed in claim 33 wherein said spacing is set by spacers supported on the plate.

36. A method as claimed in claim 33 wherein the spacers are supported on the form.

37. A method as claimed in claim 5 or 20 wherein the layers have respective X and Y directions which are perpendicular to each other and are arranged such that the resulting composite has an equal flexural modulus of elasticity in the X and Y directions.

38. In a method for making a printed circuit board of a set of filament sections in a settable matrix, the steps comprising forming by winding on a flat mandrel at least one set of filament sections as a plurality of superposed layers of filament sections with the filament sections in each layer being arranged generally in the same direction and with the direction of the filament sections in at least one layer in such set being arranged at an angle to the direction of the filament sections in other layers in such set; arranging said layers in mirror image relationship relative to a plane of symmetry parallel to the layers of the set, all of the filament sections aligned generally in the same direction being under the same tension; introducing a settable matrix capable of bonding to said filament sections; and curing the matrix by electromagnetic radiation wherein an outer plate constitutes one electrical pole for such radiation, the mandrel constitutes the other electrical pole therefor, and the matrix constitutes the dielectric between the poles.

39. A method as claimed in claim 3 wherein the flat form is made to include a section in a right quadrilateral shape and alternate layers and respectively wound in criss-cross directions on said form, including the step of winding the layers with a density of filament sections in the respective directions corresponding to the desired elastic modulus in such directions.

40. A method as claimed in claim 3 wherein the pitch of the wind is greater than the width of the filament bundles being wound, whereby a pattern of spaces is provided in the laminate free of filaments.

41. A method for making a composite of a set of filament sections in a settable resin matrix, comprising forming at least one set of filament sections as a plurality of superposed layers of filament sections with the filament sections in each layer being arranged generally in the same direction and with the direction of the filament sections in at least one layer in such set being arranged at an angle to the direction of the filament sections in other layers in such set, and arranging said layers in mirror image relationship relative to a plane of symmetry parallel to the layers of the set, all of the filament sections aligned generally in the same direction being under the same tension; including the steps of subjecting said set of filament sections to a vacuum; injecting a settable resin into the set of filament sections in an amount sufficient to enclose the entire set; supporting said set and resin within mold surfaces capable of holding the filament sections in their respective orientations; wherein the tension in the filament sections at gelation temperatures is at a value such that when reduced to ambient temperature the stresses induced by resin shrinkage, filament tension and the expansion or contraction of both due to temperature reach an equilibrium so that the net stress in the composite is not greater than the critical buckling stress; removing the set of filament sections and resin, within such mold surfaces, from vacuum; and curing the resin to a hardened condition.

42. A method as claimed in claim 41 wherein the filament sections are formed by winding about a form under substantially constant tension sufficient to assure uniform lay-down of the filament sections within each layer, the molding surfaces have a flatness corresponding to the desired flatness of the finished composite, and the spacing of such molding surfaces is determined by spacers between them.

43. In a method for making a printed circuit board of a set of filament sections in a settable matrix material, the steps comprising forming at least one set of filament sections as a plurality of superposed layers of filament sections with the filament sections in each layer being arranged generally in the same direction and with the direction of the filament sections in at least one layer in such set being arranged at an angle to the direction of the filament sections in other layers in such set; and arranging such layers in mirror image relationship relative to a plane of symmetry parallel to the layers of the set, all of the filament sections aligned generally in the same direction being under the same tension; said filament sections being formed, arranged and held on a form in fixed spatial relationship prior to the introduction of a settable matrix material in a continuous phase which bonds to the filaments thereof to form said composite.

44. A method as claimed in claim 1, 20 or 43 which includes the step of forming a continuous phase of said matrix material to define outer surfaces having a flatness and surface finish sufficient for use as the surfaces of a printed circuit board.

45. A method as claimed in claim 1, 20, 41 or 43 wherein the filament sections in each layer are substantially parallel to each other, said angle is substantially ninety degrees, and the filament sections of each layer are parts of a filament arrangement unidirectionally and helically wound around a flat form, said tension being sufficient to provide a uniform arrangement of the filament sections in each layer.

46. A method as claimed in claim 1, 20, 41 or 43 wherein the filament sections in each layer are substantially parallel to each other, said angle is substantially ninety degrees, and the filament sections of each layer are parts of a filament arrangement circumferentially wound around a flat form, said tension being sufficient to provide a uniform arrangement of the filament sections in each layer.

47. A method as claimed in claim 1, 20, 41 or 43 wherein the matrix has X and Y directions along the respective filaments which are perpendicular to each other and which further comprises constructing the printed circuit board to provide thermal coefficients of expansion which are essentially the same in the X and Y directions, and to provide section modulus of elasticity values for the filaments which are tailored in the X and Y directions.

48. A method as claimed in claim 47 which further comprises tailoring the sections modulus of elasticity values in the X and Y directions to values which are substantially the same.

49. A method as claimed in claim 1 or 43 further comprising introducing a settable matrix which, after setting, fixes the filament sections in position.

50. A method as claimed in claim 49 wherein the superposed layers of filament sections are arranged to provide at least one passage through the printed circuit board free of filament sections.

51. A method as claimed in claim 50 further comprising forming a hole through said at least one passage after setting and curing of the matrix.

52. A method as claimed in claim 49 further comprising forming an electrically conductive circuit on at least one outer surface of said matrix and through said hole.

53. A method as claimed in claim 49 further comprising cutting said printed circuit board in quadrilateral form having side edges generally perpendicular to the filament sections.

54. In a method for making a printed circuit board of a set of filament sections in a settable matrix, the steps comprising forming a filamentary structure of at least one set of filament sections on a form as a plurality of superposed layers of filament sections with the filament sections in each layer being in the same direction and with the direction of the filament sections in at least one layer in such set being arranged at an angle to the direction of the filament sections in other layers in such set, and arranging said layers of said filamentary structure in mirror image relationship relative to a plane of symmetry parallel to the layers of the set, all of the filament sections aligned generally in the same direction being under the same tension; and impregnating said filamentary structure with a settable matrix material to form said printed circuit board by the steps of:

supporting such filamentary structure between at least two surfaces each having a flatness and finish corresponding to the flatness and finish of the desired printed circuit board;

subjecting the supported filamentary structure to a vacuum;

introducing a settable matrix material into the filamentary structure in an amount sufficient to fill the desired volume of the printed circuit board;

spacing the surfaces apart a distance corresponding to the desired dimension of such printed circuit board; and curing the matrix material to the desired hardness.

55. A method as claimed in claim 54 wherein the filamentary structure is subjected to vacuum prior to introduction of said settable matrix material.

56. A method as claimed in claim 54 further comprising restoring pressure at least to ambient conditions prior to the curing step.

57. A method as claimed in claim 54 wherein the resin is introduced prior to the spacing of the surfaces to the desired dimension of the printed circuit board.

58. A method as claimed in claim 54 wherein the filamentary structure includes a layer of cloth, and the matrix material is introduced while the filamentary structure is under vacuum.

59. A method as claimed in claim 54 wherein the filament sections are electrically non-conductive and are embodied in a continuous settable matrix of electrically non-conductive material which fixes the filament sections in position after curing.

60. A method as claimed in claim 54 wherein the settable matrix material is introduced into the filamentary structure in a manner to provide a void-free matrix after curing thereof.

61. A method as claimed in claim 54 which further comprises forming outer surfaces of said matrix with a flatness and surface finish which are suitable for use as the surfaces of a printed circuit board.

62. A method as claimed in claim 43 wherein the matrix material is a first resin and futher comprises introducing an additional resin which is compatible with said first resin.

63. A method as claimed in claim 18 wherein said resin includes one or more fillers.

64. A method as claimed in claim 54 which further comprises placing a core between said surfaces prior to introducing said settable matrix material.

65. A method as claimed in claim 64 wherein the core is made of metal.

66. A method as claimed in claim 1 or 43 wherein the matrix material is a first resin and which further comprises impregnating the filament sections with a solvent solution of said resin during winding; and flashing off the solvent prior to setting and curing of the resin.

67. A method as claimed in claim 1 wherein the matrix material is a first resin and which further comprises impregnating the filament sections with a solvent solution of said resin before winding; and flashing off the solvent prior to setting and curing of the resin.

68. A method as claimed in claim 66 or 67 which further comprises introducing an additional resin which is compatible with said first resin.

69. In a method for making printed circuit boards of a set of filament sections in a continuous settable matrix; comprising winding at least one filament continuously around a right quadrilateral flat form to form a set of filament sections as a plurality of superposed layers of filament sections on each side of the form, with the filament sections in each layer being arranged generally in the same direction and under the same tension, with the direction of the filament sections in at least one layer in each set being arranged perpendicular to the direction of the filament sections in other layers in such set; each said set being wound such that said layers are in mirror image relationship relative to a central plane of symmetry parallel to the layers of the set;

impregnating at least one of said sets with a settable, electrically non-conductive material to form a solid matrix for said sets with the tension in the filament sections at gelation temperatures being at a value such that when reduced to ambient temperature the stresses induced by matrix shrinkage, filament tension and the expansion or contraction of both due to temperature reach an equilibrium so that the net stress in the circuit board is not greater than the critical buckling stress of the printed circuit board; and separating said sets by trimming the wound filament arrangement at edges of the flat form to form the boards.

70. A method as claimed in claim 69 further comprising forming an electrically conductive circuit on at least one outer surface of said matrix.

71. A method as claimed in claim 70 wherein the superposed layers of filament sections are arranged to provide at least one passage through the printed circuit board free of filament sections.

72. A method as claimed in claim 71 further comprising forming a hole through said at last one passage after setting and curing of the matrix.

73. A method as claimed in claim 72 wherein a portion of said electrically conductive circuit extends through said hole.

* * * * *